(12) United States Patent
Helander et al.

(10) Patent No.: US 10,290,833 B2
(45) Date of Patent: *May 14, 2019

(54) FUNCTIONALIZATION OF A SUBSTRATE

(71) Applicant: OTI Lumionics Inc., Toronto, Ontario (CA)

(72) Inventors: Michael Helander, Toronto (CA); Jacky Qiu, Toronto (CA); Zhibin Wang, Toronto (CA); Zheng-Hong Lu, Toronto (CA)

(73) Assignee: OTI Lumionics Inc., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/423,988

(22) Filed: Feb. 3, 2017

(65) Prior Publication Data

US 2017/0149022 A1    May 25, 2017

Related U.S. Application Data

(63) Continuation of application No. 14/391,846, filed as application No. PCT/CA2013/050291 on Apr. 15, (Continued)

(30) Foreign Application Priority Data

Apr. 13, 2012    (CA) .................................... 2774591

(51) Int. Cl.
*H01L 51/56* (2006.01)
*H01L 51/52* (2006.01)
(Continued)

(52) U.S. Cl.
CPC ............... *H01L 51/56* (2013.01); *H01B 1/00* (2013.01); *H01L 31/022466* (2013.01); (Continued)

(58) Field of Classification Search
CPC . H01L 51/0021; H01L 51/5215; H01L 51/56; H01L 31/1884; H01L 51/5206;
(Continued)

(56) References Cited

U.S. PATENT DOCUMENTS 3,616,333 A    10/1971    Farmakides
4,258,334 A     3/1981    McCusker et al.
(Continued)

FOREIGN PATENT DOCUMENTS

CN    102076891 A      5/2011
EP       1798784 A2 *  6/2007    ......... H01L 51/5088
(Continued)

OTHER PUBLICATIONS

Chan, I-M et al. "Plasma treatment of indium tin oxide anodes in carbon tetrafluoride (CF4)/oxygen (02) to improve the performance of organic light-emitting diodes", Thin Solid Films, 444(1-2), (2003), 254-259.*

(Continued)

*Primary Examiner* — Bitew A Dinke
(74) *Attorney, Agent, or Firm* — Schwegman Lundberg & Woessner, P.A.

(57) ABSTRACT

A method of increasing a work function of an electrode is provided. The method comprises obtaining an electronegative species from a precursor using electromagnetic radiation and reacting a surface of the electrode with the electronegative species. An electrode comprising a functionalized substrate is also provided.

16 Claims, 28 Drawing Sheets

Related U.S. Application Data 2013, now Pat. No. 9,698,386, which is a continuation-in-part of application No. 13/446,927, filed on Apr. 13, 2012, now Pat. No. 8,853,070.

(60) Provisional application No. 61/673,147, filed on Jul. 18, 2012, provisional application No. 61/806,855, filed on Mar. 30, 2013.

(51) Int. Cl.

| | | |
|---|---|---|
| *H01B 1/00* | (2006.01) | |
| *H01L 31/0224* | (2006.01) | |
| *H01L 51/50* | (2006.01) | |
| *H01L 31/18* | (2006.01) | |
| *H01L 51/00* | (2006.01) | |

(52) U.S. Cl.
CPC ........ *H01L 31/1884* (2013.01); *H01L 51/0021* (2013.01); *H01L 51/5088* (2013.01); *H01L 51/5206* (2013.01); *H01L 51/5215* (2013.01); *Y02E 10/50* (2013.01)

(58) Field of Classification Search
CPC ........ H01L 51/5088; H01L 31/022466; H01B 1/00; Y02E 10/50
See application file for complete search history.

(56) References Cited

U.S. PATENT DOCUMENTS

| | | | |
|---|---|---|---|
| 4,531,076 A | 7/1985 | Holder | |
| 4,945,546 A | 7/1990 | Gole et al. | |
| 5,000,831 A | 3/1991 | Osawa et al. | |
| 5,184,015 A | 2/1993 | Allman et al. | |
| 5,302,420 A * | 4/1994 | Nguyen | B05D 1/62 |
| | | | 427/255.39 |
| 5,314,573 A | 5/1994 | Higuchi et al. | |
| 5,463,271 A | 10/1995 | Geis et al. | |
| 5,556,500 A | 9/1996 | Hasegawa et al. | |
| 5,897,331 A | 4/1999 | Sopori | |
| 5,935,390 A | 8/1999 | Felix et al. | |
| 6,083,413 A | 7/2000 | Sawin et al. | |
| 6,091,186 A | 7/2000 | Cao et al. | |
| 6,097,147 A | 8/2000 | Baldo et al. | |
| 6,127,004 A | 10/2000 | Hatwar et al. | |
| 6,164,295 A | 12/2000 | Ui et al. | |
| 6,208,075 B1 | 3/2001 | Hung et al. | |
| 6,657,378 B2 | 12/2003 | Forrest et al. | |
| 7,041,608 B2 | 5/2006 | Sieber et al. | |
| 7,468,285 B2 | 12/2008 | Yamazaki et al. | |
| 7,612,422 B2 | 11/2009 | Chambers et al. | |
| 7,683,536 B2 | 3/2010 | Forrest et al. | |
| 7,737,625 B2 | 6/2010 | Arakane et al. | |
| 7,807,275 B2 | 10/2010 | Adamovich et al. | |
| 7,871,532 B2 | 1/2011 | Shimizu et al. | |
| 8,058,796 B2 | 11/2011 | Lee et al. | |
| 8,853,070 B2 * | 10/2014 | Helander | H01L 51/5206 |
| | | | 257/10 |
| 9,698,386 B2 | 7/2017 | Helander et al. | |
| 2003/0087127 A1 | 5/2003 | Lee et al. | |
| 2003/0196760 A1 * | 10/2003 | Tyler | H01J 37/32082 |
| | | | 156/345.47 |
| 2004/0035532 A1 | 2/2004 | Jung | |
| 2004/0062947 A1 | 4/2004 | Lamansky et al. | |
| 2005/0001543 A1 | 1/2005 | Nomura et al. | |
| 2006/0024450 A1 | 2/2006 | Lin et al. | |
| 2006/0046082 A1 | 3/2006 | Kumazawa et al. | |
| 2006/0134347 A1 | 6/2006 | Chiruvolu et al. | |
| 2006/0221540 A1 | 10/2006 | Himori et al. | |
| 2007/0238913 A1 | 10/2007 | Knupp et al. | |
| 2008/0105866 A1 | 5/2008 | Jeong et al. | |
| 2008/0110859 A1 | 5/2008 | Koshiishi et al. | |
| 2008/0146011 A1 * | 6/2008 | Yoon | B82Y 30/00 |
| | | | 438/584 |
| 2008/0157228 A1 * | 7/2008 | Chambers | H01L 21/28079 |
| | | | 257/407 |
| 2008/0283916 A1 | 11/2008 | Yamazaki | |
| 2009/0001886 A1 | 1/2009 | Ibe et al. | |
| 2009/0029528 A1 * | 1/2009 | Sanchez | C30B 25/08 |
| | | | 438/476 |
| 2009/0066223 A1 | 3/2009 | Yabe et al. | |
| 2009/0126634 A1 * | 5/2009 | Yamazawa | C23C 16/5096 |
| | | | 118/723 R |
| 2011/0001423 A1 | 1/2011 | Natori et al. | |
| 2011/0031481 A1 | 2/2011 | Von Wrochem et al. | |
| 2011/0114935 A1 | 5/2011 | Sharma et al. | |
| 2011/0195533 A1 | 8/2011 | Rajeswaran | |
| 2011/0203667 A1 * | 8/2011 | Liao | H01L 51/5088 |
| | | | 136/263 |
| 2011/0212546 A1 | 9/2011 | Bertram, Jr. et al. | |
| 2011/0291022 A1 | 12/2011 | Lee et al. | |
| 2012/0003485 A1 | 1/2012 | Habich et al. | |
| 2012/0051996 A1 * | 3/2012 | Scarsbrook | B82Y 10/00 |
| | | | 423/446 |
| 2012/0269962 A1 | 10/2012 | Blomberg et al. | |
| 2013/0122647 A1 | 5/2013 | Steiger et al. | |
| 2013/0162142 A1 * | 6/2013 | Nishino | H05H 1/46 |
| | | | 315/111.21 |
| 2013/0214356 A1 | 8/2013 | Cheng et al. | |
| 2013/0240853 A1 * | 9/2013 | Cao | H01L 51/442 |
| | | | 257/40 |
| 2014/0014167 A1 | 1/2014 | Machida et al. | |
| 2015/0050458 A1 * | 2/2015 | Helander | H01L 51/5206 |
| | | | 428/141 |
| 2015/0069354 A1 * | 3/2015 | Helander | H01L 31/022466 |
| | | | 257/40 |

FOREIGN PATENT DOCUMENTS

| | | | |
|---|---|---|---|
| JP | 2000150172 A | * | 5/2000 |
| JP | 2000150172 A | | 5/2000 |
| JP | 2000-277256 A | | 10/2000 |
| JP | 2000277256 A | | 10/2000 |
| JP | 2002-270369 A | | 9/2002 |
| JP | 2008159381 A | | 7/2008 |
| KR | 10-0340411 B1 | | 6/2002 |
| KR | 20090115579 A | * | 11/2009 |
| KR | 20090115579 A | * | 11/2009 |
| WO | WO-2010010855 A1 | | 1/2010 |
| WO | WO-2012047812 A2 | | 4/2012 |
| WO | WO-2013152446 A1 | | 10/2013 |

OTHER PUBLICATIONS

Chen et al. "Concomitant tuning of metal work function and wetting property with mixed self-assembled monolayers", organic Electronics 12 (2011) 148-153.*

C S Corr et al. "Comparison between fluid simulations and experiments in inductively coupled argon/chlorine plasmas", J. Physs. D: Appl. Phys.41 (2008) 185202 (9pp) (Year: 2008).*

Han Na Cho et al. "Etch Characteristics of Nickel Oxide Thin Films Using Inductively Coupled Plasma Reactive Ion Etching", Electrochemical and Solid-Sate Letters, 11 (2) D23-D26 (2008) (Year: 2008).*

"Japanese Application No. 2015-504828, Office Action dated Oct. 3, 2017", With English Translation, (10/03/017), 9 pgs.

"U.S. Appl. No. 14/391,846, Notice of Allowance dated Mar. 3, 2017", 10 pgs.

"U.S. Appl. No. 14/471,807, Office Action dated Jan. 23, 2017", (dated Jan. 23, 2017), 30 pgs.

"European Application Serial No. 13775065.9, Communication Pursuant to Article 94(3) dated May 11, 2017", (dated May 11, 2017), 6 pgs.

"Japanese Application No. 2015-504828, Office Action dated Apr. 4, 2017", w/ English Translation, (dated Apr. 4, 2017), 4 pgs.

"Canadian Application Serial No. 2,774,591, Office Action dated Dec. 11, 2017", (dated Dec. 11, 2017), 4 pgs.

Temesghen, Woldegbr F., et al., "Coordination chemistry of electrode surfaces: selective coordination and ligand substitution of

(56) References Cited

OTHER PUBLICATIONS halides at Pd(110) single crystals", The Electrochemical Society Proceedings, vol. 96-8, (1996), 58-60.
"U.S. Appl. No. 13/446,927, Amendment After Notice of Allowance filed Aug. 28, 2014", 4 pgs.
"U.S. Appl. No. 13/446,927, Final Office Action dated Mar. 13, 2014", 27 pgs.
"U.S. Appl. No. 13/446,927, Interview Summary dated May 5, 2014", 3 pgs.
"U.S. Appl. No. 13/446,927, Non-Final Office Action dated Mar. 20, 2013", 13 pgs.
"U.S. Appl. No. 13/446,927, Non-Final Office Action dated Sep. 17, 2013", 22 pgs.
"U.S. Appl. No. 13/446,927, Notice of Allowance dated May 28, 2014", 8 pgs.
"U.S. Appl. No. 13/446,927, Response filed May 6, 2014 to Interview Summary dated May 5, 2014 and Final Office Action dated Mar. 13, 2014", 7 pgs.
"U.S. Appl. No. 13/446,927, Response filed Jul. 22, 2013 to Non-Final Office Action dated Mar. 20, 2013", 16 pgs.
"U.S. Appl. No. 13/446,927, Response filed Dec. 17, 2013 to Non-Final Office Action dated Sep. 17, 2013", 18 pgs.
"U.S. Appl. No. 14/391,846, Final Office Action dated Sep. 4, 2015", 18 pgs.
"U.S. Appl. No. 14/391,846, Final Office Action dated Nov. 17, 2015", 18 pgs.
"U.S. Appl. No. 14/391,846, Non Final Office Action dated Mar. 11, 2015", 14 pgs.
"U.S. Appl. No. 14/391,846, Non Final Office Action dated Jun. 24, 2016", 18 pgs.
"U.S. Appl. No. 14/391,846, Notice of Allowance dated Nov. 8, 2016", 8 pgs.
"U.S. Appl. No. 14/391,846, Response filed May 16, 2016 to Final Office Action dated Nov. 17, 2015", 12 pgs.
"U.S. Appl. No. 14/391,846, Response filed Jul. 31, 2015 to Non Final Office Action dated Mar. 11, 2015", 9 pgs.
"U.S. Appl. No. 14/391,846, Response filed Sep. 26, 2016 to Non Final Office Action dated Jun. 24, 2016", 7 pgs.
"U.S. Appl. No. 14/391,846, Response filed Nov. 4, 2015 to Final Office Action dated Sep. 4, 2015", 10 pgs.
"U.S. Appl. No. 14/471,807, Final Office Action dated Sep. 4, 2015", 11 pgs.
"U.S. Appl. No. 14/471,807, Non-Final Office Action dated Feb. 26, 2015", 22 pgs.
"U.S. Appl. No. 14/471,807, Notice of Non-Compliant Amendment dated Jul. 10, 2015", 2 pgs.
"U.S. Appl. No. 14/471,807, Office Action dated Jul. 29, 2016", (dated Jul. 29, 2016), 12 pgs.
"U.S. Appl. No. 14/471,807, Office Action dated Feb. 5, 2016", (dated Feb. 5, 2016), 11 pgs.
"U.S. Appl. No. 14/471,807, Preliminary Amendment dated Nov. 6, 2014", 7 pgs.
"U.S. Appl. No. 14/471,807, Responsd filed Nov. 29, 2016 to Office Action dated Jul. 29, 2016", (dated Nov. 29, 2016), 9 pgs.
"U.S. Appl. No. 14/471,807, Response filed Jun. 26, 2015 to Non-Final Office Action dated Feb. 26, 2015", 10 pgs.
"U.S. Appl. No. 14/471,807, Response filed Jul. 22, 2015 to Notice dated Jul. 10, 2015", 5 pgs.
"Chinese Application Serial No. 2013800197564, Search Report dated Jan. 14, 2016", in English, 3 pgs.
"European Application Serial No. 13775065.9, Extended European Search Report dated Nov. 25, 2015", 11 pgs.
"International Application Serial No. PCT/CA2013/050291, International Preliminary Examination dated Oct. 14, 2014", 6 pgs.
"International Application Serial No. PCT/CA2013/050291, International Search Report dated Aug. 5, 2013", 3 pgs.
"International Application Serial No. PCT/CA2013/050291, Written Opinion dated Aug. 5, 2013", 5 pgs.
"Machine Translation of JP 2000-277256A, published Oct. 6, 2000", 30 pgs.

Campbell, I. H., et al,, "Controlling charge injection in organic electronic devices using self-assembled monolayers", Appl. Phys. Lett., 71, (1997), 3528.
Chan, I-M, et al., "Plasma treatments of indium tin oxide anodes in carbon tetrafluorinde (CF4)/oxygen (O2) to improve the performance of organic light-emitting diodes", Thin Solid Films, 444(1-2), (2003), 254-259.
Choi, Beomrak, et al., "Surface treatment of indium tin oxide by SF6 plasma for organic light-emitting diodes", Appl. Phys. Lett., 76(4), (2000), 412-414.
Han, Tae-Hee, et al., "Extremely efficient flexible organic light-emitting diodes with modified graphene anode", Nature Photonics, 6, (2012), 105-110.
Hanson, Eric L., et al., "Advanced Surface Modification of Indium Tin Oxide for Improved Charge Injection in Organic Devices", J. Am. Chem. Soc., 127(28), (2005), 10058-10062.
Helander, M. G., et al., "Chlorinated indium tin oxide as a charge injecting electrode for admittance spectroscopy", Organic Electronics, 12(9), (2011), 1576-1579.
Helander, M. G., et al., "Chlorinated Indium Tin Oxide Electrodes with High Work Function for Organic Device Compatibility", Science, 332, (2011), 944-947.
Helander, M. G., et al., "Chlorinated Indium Tin Oxide Electrodes with High Work Function for Organic Device Compatibility", Supporting Online Material, Science, vol. 332, (2011), 14 pgs.
Hotchkiss, Peter J., et al., "Modification of the Surface Properties of Indium Tin Oxide with Benzylphosphonic Acids: A Joint Experimental and Theoretical Stidy", Advanced Materials, 21(44), (2009), 4496-4501.
Hotchkiss, Peter J., et al., "The Modification of Indium Tin Oxide with Phosphonic Acids: Mechanism of Binding, Tuning of Surface Properties, and Potential for Use in Organic Electronic Applications", Accounts of Chemical Research, 45(3), (2012), 337-346.
Hudson, Zachary M., et al., "Highly efficient orange electrophosphorescence from a trifunctional organoboron-Pt(II) complex", Chemical Communications, 47, Issue 2, (2011), 755-757.
Hung, L. S., et al., "Anode modification in organic light-emitting diodes by low-frequency plasma polymerization of CHF3", Appl. Phys. Lett., 78(5), (2001), 673-675.
Ikagawa, Masakuni, et al., "Study on Surface Modification of Indium Tin Oxide and Resist Surfaces Using CF4/O2 Plasma for Manufacturing Organic Light-Emitting Diodes by Inkjet Printing", Japanese Journal of Applied Physics, 47(12), (2008), 8935-8942.
Ishii, M., et al,, "Improvement of organic electroluminescent device performance by in situ plasm treatment of indium-tin-oxide surface", Journal of Luminescence, 87-89, (2000), 1165-1167.
Jeong, C. H., et al., "Characteristics of Organic Light-Emitting Devices by the Surface Treatment of Indium Tin Oxide Surfaces Using Atmospheric Pressure Plasmas", Japanese Journal of Applied Physics, 44(1), (2005), L41-L44.
Jo, Sung Jin, et al., "Characterization of CF4 Plasma-Treated Indium-Tin-Oxide Surfaces Used in Organic Light-Emitting Diodes by X-ray Photoemission Spectroscopy", Japanese Journal of Applied Physics, vol. 46, No. 10A, (2007), 6814-6816.
Li, C. N., et al., "Improved performance of OLEDs with ITO surface treatments", Thin Solid Films, 477, (2005), 57-62.
Li, F., et al., "Effects of aquaregia treatment of indium-tin-oxide substrates pf the behavior of double layered organic light-emitting diodes", Appl, Phys. Lett., 70(20), (1997), 2741-2743.
Liu, Z. W., et al., "Efficient bilayer phosphorescent organic light-emitting diodes: Direct hole injection into triplet dopants", Appl. Phys. Lett., 94, (2009), 113305-1-113305-3.
Mason, M. G., et al., "Characterization of treated indium-tin-oxide surfaces used in electroluminescent devices", J. Appl. Phys., 86, (1999), 1688-1692.
Meyer, J., et al., "Highly efficient simplified organic ligjt emitting diodes", Appl. Phys. Lett., 91, (2007), 113506-1-113506-3.
Sharma, Asha, et al., "Stabilization of the work function of indium tin oxide using organic surface modifiers in organic light-emitting diodes", Appl. Phys. Lett., 93, (2008), 163308-1-163308-3.
Sohn, Sunyoung, et al., "Transparent Conductive Oxide (TCO) Films for Organic Light Emissive Devices (OLEDs)", In: Organic Light Diode—Material, Process and Devices, (2011), 233-274.

(56) References Cited

OTHER PUBLICATIONS

Sun, Kuan, et al., "Polymer solar cells using chlorinated indium tin oxide electrodes with high work function as the anode", Solar Energy Materials & Solar Cells, 96, (2012), 238-243.
Sun, X. H., "Photoelectron spectroscopic study of iodine- and bromine-treated indium tin oxides and their interfaces with organic films", Chemical Physics Letters, 370, (2003), 425-430.
Van Slyke, S. A., et al., "Organic electroluminescent devices with improved stability", Appl. Phy. Lett., 69(15), (1996), 2160-2162.
Wang, Z. B., et al., "Direct hole injection in to 4,4'-N, N'-clicarbazole-biphenyl: A simple pathway to achieve efficient organic light emitting diodes", J. Appl. Phys., 108, (2010), 024510-1-024510-4.
Wang, Z. B., et al., "Highly simplified phosphorescent organic light emitting diode with >20% external quantum efficiency at >10,000cd/m2", Appl. Phys. Lett, 98, (2011), 073310-1-073310-3.
Wang, Z, B., et al., "Unlocking the full potential of organic light-emitting diodes on flexible plastic", Nature Photonics, 5, (2011), 753-757.
Wu, C. C., et al., "Surface modification of indium tin oxide by plasma trreatment: An effective method to improve the efficiency, brightness, and relibility of organic light emitting devices", Appl. Phys. Lett., 70(11), (1997), 1348-1350.
Xu, Z. Q., et al., "Enhanced performance in polymer photovoltaic cells with chloroform treated indium tin oxide anode modification", Appl. Phys. Lett, 98, (2011), 253303-1-253303-3.
Yang, Nam Chul, et al., "Ultra-thin fluoropolymer buffer layer as an anode stabilizer of organic light emitting devices", J. Phys. D: Appl. Phys., 40, (2007), 4466-4470.

\* cited by examiner

| Material | Work Function (eV) after exposure to air | |
|---|---|---|
| | Substrate | Chlorinated Substrate |
| NiO | 5.3 | 5.9 |
| MoO3 | 5.3 | 6.0 |
| WO3 | 5.2 | 5.9 |
| AuOx | 5.6 | 6.2 |

FIG. 11

| Reference | # of Organic Layers | # of Organic Molecules | EQE (%) at 10,000 cd/m2 |
|---|---|---|---|
| Appl. Phys. Lett. 85, 3911 (2004). | 6 | 7 | ~16 |
| CF4 Plasma-treated Anode Jap. J. Appl. Phys. 46, 1186 (2007). | 6 | 7 | ~22 |
| Adv. Mater. 22, 3311 (2010). | 4 | 6 | ~18 |
| OLED comprising a chlorine-functionalized anode | 3 | 3 | 25.5 |

FIG. 21

FUNCTIONALIZATION OF A SUBSTRATE

CROSS-REFERENCE TO RELATED APPLICATIONS

This application is a Continuation of U.S. application Ser. No. 14/391,846 filed on Apr. 15, 2013, which is a U.S. National Stage Filing under 35 U.S.C. 371 from International Application No. PCT/CA2013/050291, filed on 15 Apr. 2013, which published as WO 2013/152446 A1 on 17 Oct. 2013, which application claims priority from U.S. patent application Ser. No. 13/446,927 filed on Apr. 13, 2012, U.S. Provisional Patent Application No. 61/673,147 filed on Jul. 18, 2012, U.S. Provisional Patent Application No. 61/806,855 filed on Mar. 30, 2013, and Canadian Patent Application No. 2,774,591 filed on Apr. 13, 2012 the contents of each of which are hereby incorporated by reference in their entirety.

TECHNICAL FIELD

The following relates generally to functionalization of a substrate.

BACKGROUND

Organic light emitting diodes (OLEDs) are becoming more widely used in displays and other optoelectronic applications. Organic electronic displays typically consist of a matrix of OLEDs, each of which comprises thin films of organic materials that emit light when excited by an electric current. The organic thin films are typically sandwiched between an anode and a cathode, which provide an electric current to the organic thin film to enable the film to emit light. In a display, the light emitted by the organic thin film must exit the thin film and penetrate through at least one of the electrodes to be visible to a user. Hence, at least one of the electrodes in the electrode pair comprises a transparent conductor such as a transparent conducting oxide (TCO).

Indium tin oxide (ITO) is the most commonly used TCO due to its transparency and its high conductivity relative to other TCOs. ITO is used in various applications requiring transparency and conductivity including liquid crystal displays, plasma displays, photovoltaics, electronic ink displays, and OLED displays. ITO is typically deposited as a thin film on a transparent substrate such as glass.

In the context of OLEDs, an ITO layer is typically formed on a transparent substrate used as the anode. Holes are injected from the anode into a hole transport layer (HTL), which carries the holes to the light emitting thin film layer. Concurrently, electrons are injected via the cathode and are transported through the electron transport layer (ETL) and recombine with the holes in the light emitting thin film layer to release a photon. The photon emitted in the thin film layer may then escape the thin film layer, pass through the NTL and exit the OLED device through the ITO layer and the transparent substrate.

The energy required to inject holes from the anode is dependent on the hole injection barrier height. The hole injection barrier height depends on the difference between the work function of the anode and the highest occupied molecular orbital (HOMO) of the adjacent organic layer. The hole injection barrier of existing OLEDs is high but this can be mitigated by providing one or more intermediate organic layers. Each organic layer has a subsequently deeper HOMO level, enabling holes to pass through a larger number of smaller injection barriers rather than a single large injection barrier. However, each additional organic layer increases the cost of the device and decreases the yield of the manufacturing process.

It is an object of the present invention to mitigate or obviate at least one of the above disadvantages.

SUMMARY

In a first aspect, there is provided a method of increasing a work function of an electrode comprising obtaining an electronegative species from a precursor using electromagnetic radiation; and reacting a surface of the electrode with the electronegative species.

The electronegative species may be a halogen. The electromagnetic radiation may have a wavelength of at least about 100 nm. The electromagnetic radiation may have a wavelength of less than about 400 nm. The method may further comprise cleaning the surface of the electrode. The electrode may be a transparent conducting oxide. The transparent conducting oxide may be ITO. The electronegative species may be selected to obtain an electrode of a predetermined work function. The surface coverage of the species may be selected to obtain an electrode of a predetermined work function. Up to about a monolayer of halogen may functionalized to the substrate. The halogen may be chlorine. The precursor may be a volatile liquid. The precursor may be a gas. The substrate may be functionalized to increase its stability in air.

In another aspect, an electrode comprising a substrate functionalized according to the above method is provided. An organic electronic device comprising the electrode is also provided.

In yet another aspect, there is provided the use of a system to chemically functionalize a substrate with a species, the system comprising a reaction chamber; a radiation emitter operable to emit electromagnetic radiation into the reaction chamber; wherein the reaction chamber is operable to receive a precursor of the species and a substrate; and wherein the electromagnetic radiation generates radicals from the precursor of the species to chemically bond with the substrate. The radiation emitter may emit radiation having a wavelength of at least about 100 nm. The radiation emitter may emit radiation having a wavelength of less than about 400 nm. In an example embodiment, the radiation emitter is external to the reaction chamber; and the reaction chamber is operable to at least partially transmit ultraviolet radiation from the radiation emitter.

In yet another aspect, there is provided a method of increasing a work function of an electrode comprising obtaining chlorine from a precursor using a plasma; and reacting a surface of the electrode with the chlorine to form at least about 20% of a chlorine monolayer. In an example embodiment, up to about a monolayer of chlorine may be reacted to the surface of the electrode. The substrate may comprise a transparent conducting oxide. The transparent conducting oxide may be ITO. The surface coverage of the chlorine may be selected to obtain an electrode of a predetermined work function.

In yet another aspect there is provided an electrode comprising a substrate functionalized with at least about 20% of a monolayer of halogen. There is also provided an organic electronic device comprising the electrode. The organic electronic device may comprise an organic light emitting diode. The organic light emitting diode may be phosphorescent. The organic light emitting diode may be fluorescent.

BRIEF DESCRIPTION OF THE DRAWINGS

Embodiments will now be described by way of example only with reference to the appended drawings wherein:

FIG. 11 is a table showing the work function of various chlorinated and bare substrates after exposure to air;

FIG. 21 is a table comparing the efficiency of the OLED of FIG. 17 comprising a monolayer of chlorine on the ITO anode to phosphorescent green OLED devices in the prior art;

DETAILED DESCRIPTION

Figure 1:
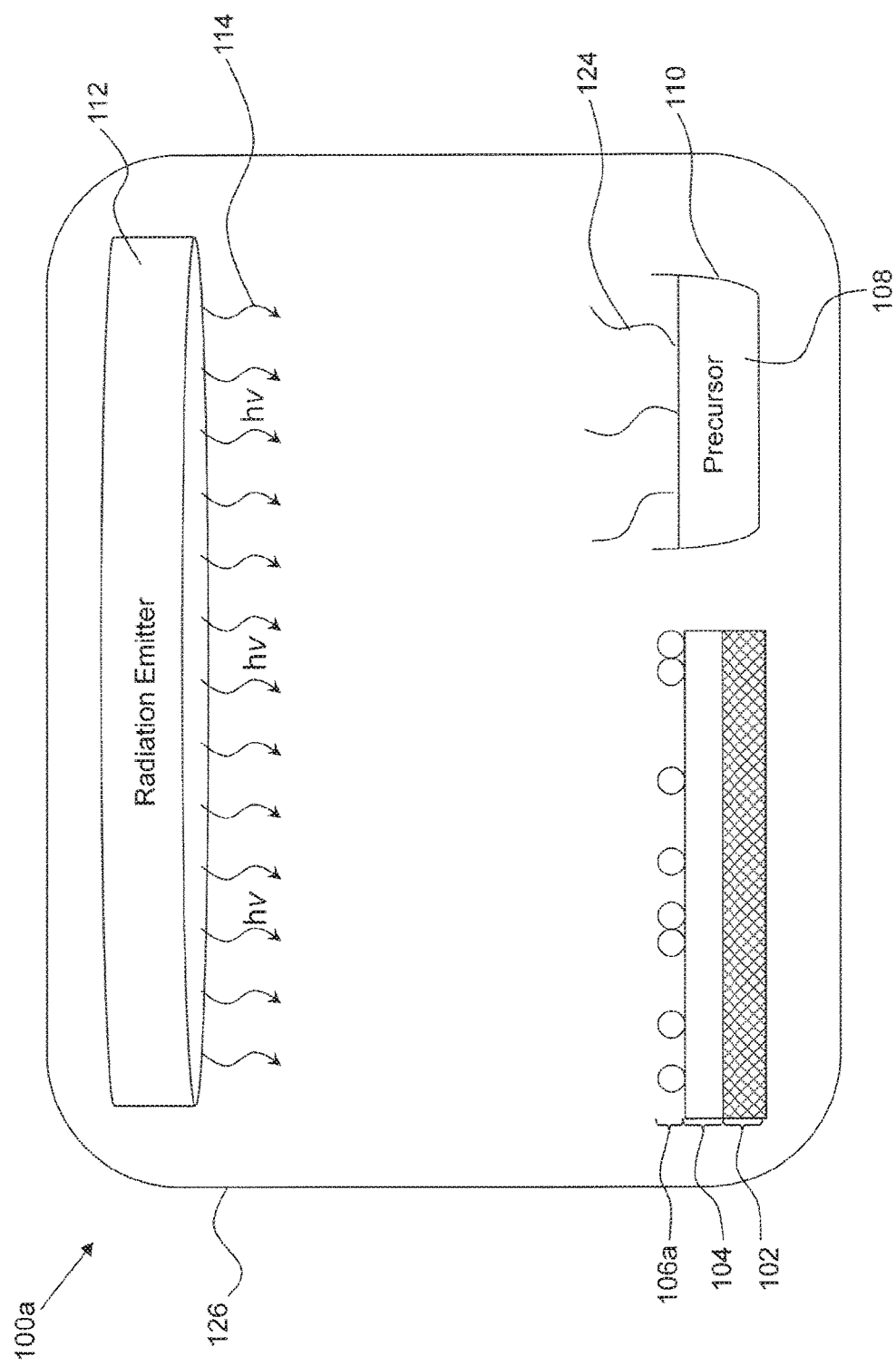
FIG. 1 is a diagram illustrating a system in accordance with the present invention comprising a substrate which is functionalized with approximately 0.5 of a monolayer of a species.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein.

Also, the description is not to be considered as limiting the scope of the example embodiments described herein. For example, reference is made to functionalizing a transparent conducting oxide (TCO) substrate. It will be appreciated that other substrates may be functionalized using the process described herein. Other non-transparent or non-conducting substrates may also be functionalized according to the process described herein.

Provided herein is a method of functionalization of a substrate with a species. In particular, the functionalization of an electrode with an electronegative species to increase the work function of the electrode is provided. Also provided is a method of functionalizing TCO electrodes to achieve a higher work function without materially altering critical properties of the TCO electrode such as conductivity and device stability. In one embodiment, the substrate is functionalized using plasma disassociation of a precursor to release a reactive species, for example, a halogen species. The halogen species is chemically reacted with a substrate to increase the work function of the substrate.

Also provided is a substrate functionalized with up to about a monolayer of electronegative species. The electronegative species may be a halogen. The halogen may be chlorine. The substrate may be a TCO. An electrode comprising a functionalized substrate is also provided. The substrate may be functionalized to increase the work function of the electrode. In an example embodiment, the substrate is functionalized with at least about 20 percent of a monolayer. A functionalization of about 20 percent may be a significant accomplishment. An organic electronic device employing an electrode comprising a functionalized substrate is also provided.

It has now been found that transparent conducting oxides including indium tin oxide (ITO), which may also be referred to as tin-doped indium oxide, may be directly used as an electrode in an organic electronic device such as an organic light emitting diode (OLED). The work function of ITO is approximately 4.7 eV in a vacuum. Because 4.7 eV rarely matches the highest occupied molecular orbital (HOMO) level of many common hole transporting materials, the use of ITO as an anode causes a high hole injection barrier and poor operational stability of the device. It is well known that an anode having a work function that is closer in energy to the HOMO level of the adjacent hole transporting organic material would reduce the hole injection barrier, thereby reducing the required operating voltage and increasing the efficiency and operation stability of organic electronic devices.

In the case of OLEDs, the active light emitting materials typically have HOMO levels much greater than 4.7 eV. For example the HOMO level of tris(8-hydroxyquinolinato) aluminium ($Alq_3$), a fluorescent green light emitting compound, is 5.75 eV. Although some organic light emitting materials may have HOMO levels closer to 4.7 eV, these materials are typically doped into a host matrix that has a much higher HOMO level than 4.7 eV. Typically, holes must be injected into the HOMO of the host in order for the dopant to emit light. For example, the HOMO level of tris(2-phenylpyridine)iridium(III) [$Ir(ppy)_3$], a phosphorescent green light emitting compound is 5.4 eV, but is commonly doped into a 4,4'-bis(carbazol-9-yl)biphenyl (CBP) matrix. CBP has a HOMO level of 6.1 eV, which is much greater than 4.7 eV. In particular, the HOMO levels of the host materials used in phosphorescent OLEDs are about 6 eV or greater. Therefore, there exists a need for a transparent electrode having a work function that is greater, and preferably slightly greater, than the HOMO level of host materials used in OLEDs. In particular, there exists a need for a transparent electrode having a work function of about 6 eV or higher.

One way to increase the work function of a TCO substrate is to clean the surface of the substrate to remove contaminants. For example, the surface of the TCO substrate may be cleaned using ultraviolet (UV) ozone or $O_2$ plasma treatment. Plasma surface treatment and UV ozone surface treatment are effective in removing organic contaminants and may leave electronegative species on the surface of the TCO substrate. By way of example, UV ozone cleaning of the surface of an ITO substrate may increase its work function to about 5.0 eV. Cleaning the substrate may cause band bending at the surface of the substrate and an increase in the surface dipole of the TCO due to electronegative oxygen species on the surface of the substrate, thereby increasing the work function of the ITO substrate. Although reference is made to cleaning the TCO substrate using UV ozone or $O_2$ plasma, the substrate may be cleaned using liquid cleaning methods, for example, using a detergent or solvent.

It has been recognized that another way to raise the work function of ITO, which is an important TCO substrate, is to chemically treat the ITO substrate with an electronegative halogen, for example, fluorine. In the example of an ITO substrate, a halogen may be reacted with indium atoms or tin atoms on the surface of the substrate to form up to an approximate layer of indium halide. The process of reacting a surface of the TCO substrate with a halogen may be referred to as "functionalization".

One way to chemically treat a TCO substrate with halogen is to react the surface of the substrate with a halogen-containing acid (e.g. hydrochloric acid). A halogen gas may also be dissolved in a carrier liquid to be applied to the surface of a TCO electrode. However, these processes are difficult to control, may etch the surface of the substrate, and may leave very little halogen functionalized to the surface of the substrate. Hence, the substrate surface may become rougher, and more contaminated, while the work function of the electrode may not be sufficiently increased. Furthermore, the conductivity and transparency of the substrate may be reduced using this process. Halogenation of a substrate using an elemental hydrogen containing solution (e.g. HCl) may be combined with UV ozone or $O_2$ plasma treatment.

The work function of a TCO substrate may also be increased using a halogen containing plasma, which may cause a halide species to react with the surface of the TCO. For example, a fluorocarbon plasma such as $CFH_3$, an inorganic fluorine containing plasma such as $SF_6$, or a pure halogen plasma such as $F_2$ may be used. Multiple plasma gasses may be used in combination. A carrier gas may also be used, for example, Ar, He, or $N_2$.

Halogen-containing plasmas are typically used as standard reactive ion etching (RIE) industrial processes to dry etch substrates including TCO electrodes. Therefore, halogen-containing plasmas typically etch the surface of the substrate. This may decrease the conductivity of the surface and may contaminate the surface with halocarbons. Halocarbons are molecules comprising one or more carbon atoms covalently bonded to one or more halogen atoms (e.g. fluorine, chlorine, iodine, and bromine). The chemical bond between the contaminant and the substrate depends on the materials involved, type of plasma used and the processing conditions. The addition of an oxidant (e.g. $O_2$) may reduce the amount of deposited halocarbons and may also increase the rate at which the substrate is etched, negatively affecting other properties of the substrate. As is further described below, an example apparatus is provided for functionalizing species to the surface of a substrate while reducing the etching of the substrate.

It may be expected from the electronegativity of each of fluorine, chlorine, iodine, and bromine that fluorine functionalization provides the highest increase in work function since it has the highest electronegativity and therefore, would be expected to form the largest surface dipole. Surprisingly, it has now been found that chlorine functionalized TCO's have a yet higher work function. This has been confirmed from density functional theory calculations and experimental results as measured by X-ray photoelectron spectroscopy (XPS) using an ITO substrate that has been functionalized according to the process described herein. Table 1 summarizes these results.

TABLE 1

Experimental and Theoretical Work Function of Functionalized ITO

| Halogen Functionalized to ITO Surface | Experimental Work Function (XPS) [eV] | Density Functional Theory Calculation [eV] |
|---|---|---|
| fluorine | 5.7 | 5.7 |
| chlorine | 6.1 | 6.1 |

TABLE 1-continued

Experimental and Theoretical Work Function of Functionalized ITO

| Halogen Functionalized to ITO Surface | Experimental Work Function (XPS) [eV] | Density Functional Theory Calculation [eV] |
|---|---|---|
| bromine | 5.4 | — |
| iodine | 5.2 | — |

Therefore, a chlorine-functionalized TCO may have a higher work function relative to TCO's functionalized with other halogens.

The above mentioned UV ozone and $O_2$ plasma cleaning treatments are reversible. For example, the surface of the cleaned TCO substrate may be re-contaminated, electronegative species on the surface of the TCO may desorb, and the surface of the substrate is prone to hydrolysis. The above-described halogenation treatments offer greater stability than the UV ozone or $O_2$ plasma treatments, however, typical application of these treatments are prone to etching the surface of the TCO substrate. Furthermore, these halogenations treatments may affect other critical properties including the surface roughness, conductivity and transparency of the TCO. Also, handling halogen-containing gases for plasma processes requires special safety precautions due to the toxicity and reactive nature of the materials involved.

The above-mentioned techniques may be unable to increase the work function of TCO substrates to a level enabling efficient injection of holes into hole transporting organic materials with deep HOMO levels (e.g. 6 eV or greater). As a result, additional hole injection layers (HILs) and hole transport layers (HTLs) with HOMO levels between the work function of the TCO substrate and the HOMO level of the active organic layer are typically required in practical organic optoelectronic devices to facilitate charge injection from the anode. For example, a number of intermediate organic layers may be used, each having a subsequently deeper HOMO level. This enables holes to pass through a larger number of smaller injection barriers rather than a single large injection barrier. Each additional layer increases the cost of the device and decreases the yield of the manufacturing process.

Other methods to incorporate a TCO electrode with an insufficiently high work function into a device involve coating the TCO with a high work function polymer (e.g. PEDOT), a self-assembled monolayer (SAM), or a metal oxide (e.g. $WO_3$). Such methods, however, may increase impedance, device complexity and fabrication cost, while introducing additional problems related to device stability.

The example embodiments described herein are, in one aspect, directed to the functionalization of TCO thin films with halogens to modify their work function. In particular, example embodiments are described with reference to halogens and/or halocarbons released from a halogen-containing precursor compound under ultraviolet radiation. However, it can be recognized that functionalization of other substrates using the methods described herein falls within the scope of the invention. In one embodiment, the substrate is functionalized using plasma dissociation of a precursor to release an electronegative species, for example, a halogen. The halogen is chemically reacted with a substrate to increase the work function of the substrate. For example, functionalizing a substrate with a halogen using a halogen-containing plasma, and in particular, a chlorine-containing plasma, falls within the scope of the invention, as is further described below.

In another embodiment, a method of functionalizing the surface of a substrate with a species is provided, wherein a precursor containing the species is dissociated using electromagnetic (EM) radiation. The species is then reacted with the substrate to increase the work function of the substrate. In particular, a TCO substrate may be functionalized with a halogen by dissociating the halogen atom from a precursor using EM radiation. Any wavelength of electromagnetic radiation that breaks the bond between the species and the precursor may be used, however, ultraviolet (UV) radiation, has been found to be particularly effective. In particular, UV radiation having a wavelength of between 100 nm and 400 nm was found to be effective. A catalyst may assist in breaking the bond between the halogen and the precursor. The catalyst may comprise the chemical surface of the substrate.

The chemical bond between the species and the surface may increase the stability of the functionalized material in air, as will be further described herein.

In some embodiments, and in examples that will be described herein, the halogen-containing compound is a volatile halogen-containing organic precursor. It will be appreciated that inorganic precursors may also be used. Organic precursors that release halogen atoms include halocarbons. The precursor may comprise two different halogens, for example, fluorine and chlorine. For example, the halogen-containing precursor may comprise a mixture of a fluoride and a chloride.

Example precursors include, for example, haloalkanes, haloakenes, and haloaromatics. Common chlorinated precursors include chloromethane, dichloromethane tetrachloromethane, perchloroethylene, tetrachloroethylene, 1,1,2,2-tetrachloroethane, 1,1,2-trichloroethane, carbon tetrachloride, chloroform, methylene chloride, trichloroethylene, methyl chloroform, 1,1,1-trichloroethane, 1,2,3-trichloropropane, ethylene dichloride, dichloropropane, dichlorobenzene, trichlorobenzene, propylene dichloride, 1,2-dichloroethylene, 1,1 dichloroethane, etc. The precursor may comprise a halogen-containing polymer such as polytetrafluoroethylene (PTFE). The precursor may comprise metal halides, for example, indium halides, zinc halides, and tin halides. In an example, the metal halide species is preferably a constituent metallic element of the substrate. A constituent metallic element will typically not substantially alter the surface chemistry of the substrate if the metal component of the precursor remains on the surface of the substrate. For example, an indium halide may be used as a halogen-containing species for ITO whereas a tin halide may be used as a precursor for tin oxide substrates.

Upon functionalizing the substrate, residual contamination may be removed by additional treatment with EM radiation of an appropriate wavelength. Contaminants may be removed using a UV ozone treatment and/or using an appropriate plasma cleaning treatment, such as $O_2$ plasma. The cleaning process is performed at a low energy to reduce the likelihood of the surface of the substrate being etched. When using an organic precursor, oxygen reacts with the remnants of organic precursor molecules to form volatile molecules (e.g. $CO_2$ and $H_2O$) which may be advantageously flushed from the surface of the substrate. Volatile molecules may also evaporate from the surface of the substrate. Hence, in some embodiments, organic precursors may leave less contamination in comparison with inorganic precursors after a cleaning step.

However, inorganic precursors may be used in the methods described herein. Examples of these precursors include pure halogen gases, hydrogen halides, boron halides, sulphur halides, and phosphorus halides.

In some embodiments, the substrate may be functionalized with other elements, for example, sulphur, boron, or phosphorus using appropriate volatile precursors. For example, ammonium sulphide can be used to functionalize a substrate with sulphur. Other species that may be functionalized to the surface of a substrate to alter the work function may be used.

The process of treating the substrate involves obtaining a transparent conducting (TC) substrate, for example, an ITO film deposited on glass. Other example TCO substrates include TCOs deposited on glass, such as tin oxide, indium oxide, cadmium oxide, FTO, ZnO, NiO, MoO3, WO3, AuOx (oxidized gold), cadmium tin oxide (CTO), zinc tin oxide (ZTO), antimony tin oxide (ATO), aluminum zinc oxide (AZO), titanium zinc oxide (TZO), gallium zinc oxide (GZO), aluminum gallium zinc oxide (AGZO), indium gallium zinc oxide (IGZO), gallium indium oxide (GIO), zinc indium oxide (ZIO), gallium indium tin oxide (GITO), zinc indium tin oxide (ZITO), titanium indium oxide (TIO), tin cadmium oxide (TCO), indium cadmium oxide (ICO), zinc cadmium oxide (ZCO), aluminum cadmium oxide (ACO). It will be appreciated that other substrates including transparent conducting (TC) substrates may be used.

The TC substrate may be deposited on a transparent mechanical supporting layer, for example, glass. The mechanical supporting layer may be rigid, flexible, planar, curved, or any other geometry that may be functionalized using the method described herein.

The substrate may be comprised of a plurality of different layers. For example, the substrate may comprise multiple layers of different TCOs, a metal film on top of a TCO, a metal film sandwiched between two TCO layers, or a thin layer of a high work function material such as a transition metal oxide on top of a metal or TCO layer. Various layers in the substrate may be conducting, semiconducting, or insulating.

The substrate may comprise a plurality of layers of different metals, metal oxides, TCO's, polymers and carbon based materials. The electrode may be a metal coated with a layer of metal oxide, including its native metal oxide. The electrode may be solid or porous. One or more layers of the substrate may comprise nano-material building blocks, for example nano-particles, nano-rods, nano-tubes or other nano-scale materials. One or more layers of the substrate may comprise a composite of different materials, for example nano-particles in a polymer matrix. One or more layers of the substrate may comprise micron-scale particles.

The substrate may be patterned with nano-scale or micron-scale features, for example, features to enhance the out-coupling of light from an optoelectronic device. One or more layers of the substrate may be patterned. The substrate me be comprised of a plurality of layers with different refractive index, for example to form a Bragg mirror or photonic crystal.

The substrate may be transparent, semi-transparent, opaque or reflective. The substrate may include a mechanical support layer, such as a piece of glass, flexible plastic, or semiconductor wafer. The substrate and mechanical support layer may be the same material. The substrate may be mechanically self-supporting, for example a metal foil or silicon wafer.

Although reference is made to functionalizing a substrate with a halogen, it will be appreciated that the substrate may be functionalized with other species. For example, the substrate may be functionalized with a halocarbon to affect the surface energy of the functionalized surface. Typically, halocarbon treatments erode the surface of TCO substrates less than halogenations treatments, however, the equipment required to perform the halocarbon treatments is specialized. Additionally, the conductivity of certain halocarbons is strongly dependent on processing conditions, and therefore, difficult to control. Even with precise control over processing conditions, the most conductive halocarbons, for example, conductive fluorocarbons, are much less conductive than many TCO's including ITO. However, EM dissociation of a halocarbon precursor to deposit a halocarbon film on a substrate may be achieved, as is described below with reference to FIG. 1.

Turning to FIG. 1, a system for functionalizing a substrate is provided. The system may comprise a reaction chamber 126, in which a substrate 104 can be placed. A species may be deposited on a substrate 104 in the reaction chamber 126. The precursor compound 108 can be placed, or fed into, the reaction chamber 126. The precursor compound 108 may be a volatile liquid or solid. The dissociation of the precursor 108 may take place in the vapour phase, liquid phase, or solid phase. A functionalization reaction with the surface of the substrate 104 may take place on the surface of the substrate 104 in contact with the vapour phase. The precursor compound 108 may also be a gas, in which case no evaporation of a volatile precursor compound 108 is required to render the precursor compound 108 into the vapour phase. A gas comprising the precursor compound 108 may be provided into the reaction chamber 126 through a tube (not shown).

A radiation emitter 112 emits EM radiation into the chamber 126. The radiation emitter 112 may emit UV radiation of, for example, between 100 nm and 400 nm. The radiation emitter 112 may be located within the reaction chamber 126. The radiation emitter 126 may alternately be external to the reaction chamber 126 if the walls of the reaction chamber are at least partially transparent to the radiation.

In an example embodiment, the precursor 108 is applied directly to the surface of the substrate 104, for example, in the form of a liquid or fine particulate (e.g. powder or nanoparticulate). The dissociation reaction of the precursor compound 108 and the subsequent functionalization of the substrate 104 reaction may proceed directly on the surface of the substrate 104. The reaction may be catalyzed. For example, the reaction may be catalyzed by the surface of the substrate 104. In an example embodiment, a catalyst is disposed in the system to facilitate or enable the functionalization reaction.

Specifically, in the embodiment shown in FIG. 1, the precursor compound 108 is a volatile liquid contained in an open reservoir 110. The precursor compound 108 evaporates into its vapour phase.

The substrate 104 may itself be deposited on a mechanical supporting layer 102. For example, the substrate may comprise a TCO thin film (e.g. ITO) deposited on a glass substrate. The reaction chamber 126 isolates the substrate 104 from external contaminants and retains the precursor vapour and the reactive species in the vicinity of the substrate 104.

The radiation emitter 112 is operable to emit EM radiation 114 into the reaction chamber 126 to disassociate halogen species from the halogen-containing precursor 108. The disassociation may be achieved in the vapour phase, in the liquid phase (i.e. in the reservoir 110 or on the surface of the walls of the reaction chamber 126), in the solid phase, or on the surface of a substrate. An example halogen containing volatile precursor compound is dihalobenzene.

As the halogen species chemically bonds with the substrate, a monolayer 106a begins to form. As can be seen from FIG. 1, a partial monolayer 106a corresponding to approximately half of the surface of the substrate 104 has been formed. As will be explained in further detail below, the surface properties of the substrate 104 may be tuned based on the surface coverage of the substrate 104 by the functionalizing species 106a.

As used herein, the term "monolayer" refers to a coating having approximately one layer of atoms. It is understood that a layer having slightly more or less than a monolayer would be considered a monolayer. It is also understood that a monolayer containing impurities, for example residual carbon, would be considered a monolayer.

Although the system of FIG. 1 is described in terms of functionalizing a substrate with a halogen, in some embodiments, the species being deposited is a halocarbon. The halocarbon molecule may form a polymeric structure when functionalized to the surface of the substrate. For example, a fluorocarbon film may be deposited on the surface of the substrate. Fluorocarbon films comprising a C:F ratio controllably set between 1:3 and 3:1 have been achieved and confirmed via X-ray photoelectron spectroscopy (XPS). Higher or lower ratios of carbon to halogen are possible. XPS results have indicated the presence of $CF_3$, $CF_2$, CF, C—CF, and C—H bonds. Some species, for example, halocarbons may be able to react to form multiple layers of a halocarbon film that may be several nanometers thick. The halocarbon film may be conductive or may be insulating. The work function of the surface depends on the amount and type of halocarbon.

Other properties may be changed, including surface energy, to increase or decrease the hydrophobicity of the surface. A surface may be functionalized using a template to adjust the surface energy at particular areas on the surface. A surface with a modified surface energy may interact more favourably with certain species and resist interaction with other species. For example, a hydrophobic surface would bead water while a hydrophilic surface could be wetted with water. Functionalizing particular areas of a surface may enable the functionalized regions to react with a species and the unfunctionalized regions to be resistant to reaction and vice-versa. Although reference is made to about half a monolayer being formed on the substrate 104, less than a monolayer may be formed. For example, at least about 20 percent of a monolayer may be formed on the substrate.

Figure 2:
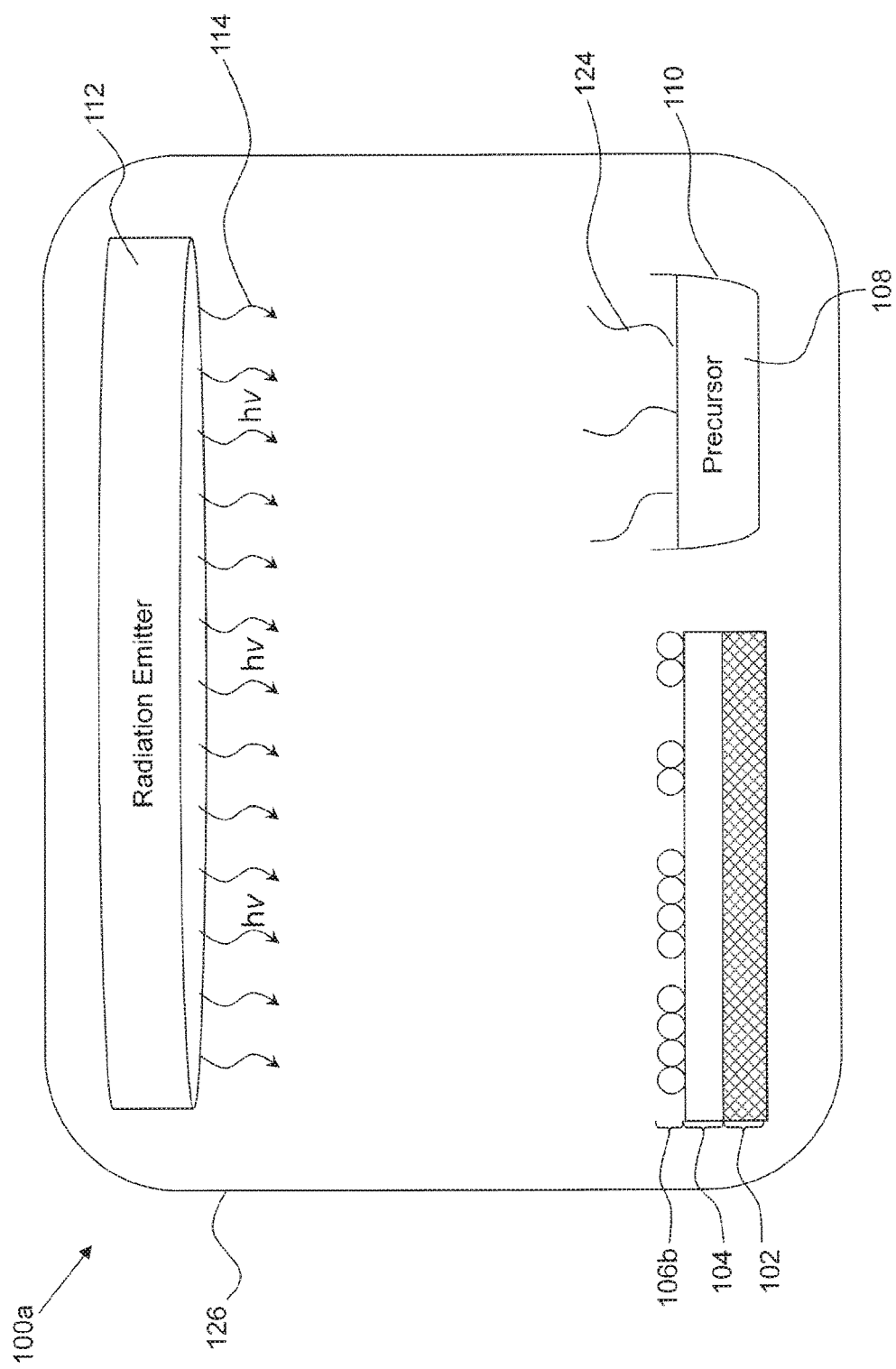
FIG. 2 is a diagram illustrating a system in accordance with the present invention wherein the substrate is functionalized with approximately 0.7 of a monolayer of the species.

Turning now to FIG. 2, the system of FIG. 1 is shown, however, the partial monolayer 106a in FIG. 1 has become more populated with chemically bonded species, as is shown by 106b. The functionalization reaction may be controlled by varying the wavelength of the electromagnetic radiation used to dissociate the halogen from the precursors, the intensity of the EM radiation, the temperature at which the reaction takes place, the precursor being used, the presence of any catalysts, the substrate, and the halogen being functionalized to the substrate. The monolayer 106b continues to form on the substrate 104 as long as halogens continue to react with the substrate 104.

Figure 3:
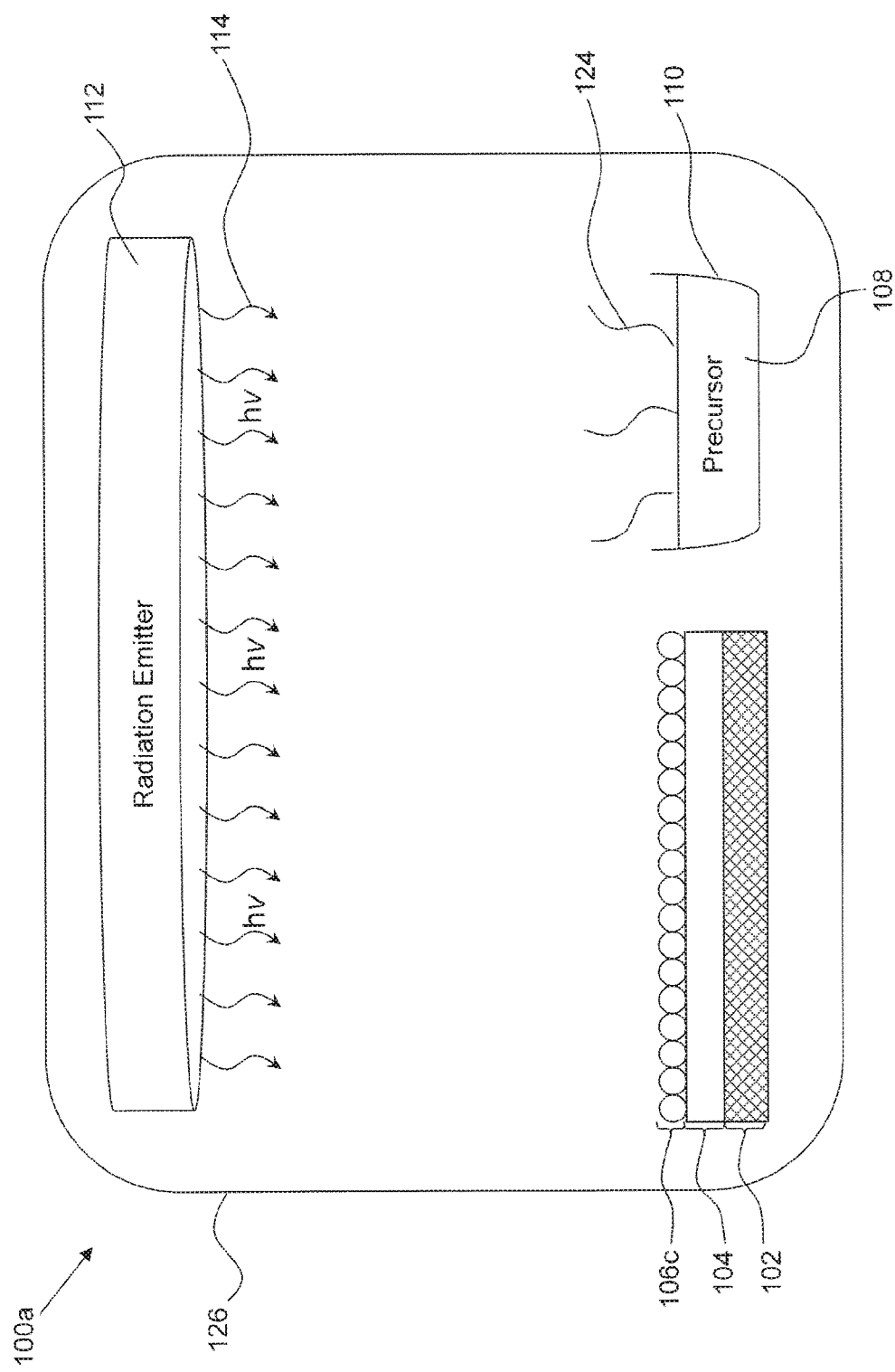
FIG. 3 is a diagram illustrating a system in accordance with the present invention wherein the substrate is functionalized with approximately one monolayer of the species.

Referring now to FIG. 3, the substrate 104 is shown with a monolayer 106c formed on its surface. As described above, the monolayer 106c may have imperfections (not shown). It may be desirable to cease the functionalization of the substrate 104 during the functionalization process prior to forming a monolayer. The disassociation of precursors 116 may be ceased by removing, blocking, or otherwise interrupting radiation from the radiation emitter 112. Once the release of halogen atoms from the precursors has ceased, the surface coverage remains substantially constant. The ability to stop the functionalization reaction almost instantaneously enables control over the degree to which the substrate 104 is functionalized.

As is known, a functionalized substrate may include contaminants. Removing organic contaminants from the surface may increase the work function of the substrate 104. After functionalizing the desired portion of the substrate 104, the substrate 104 may be cleaned. Specifically, the substrate 104 may be cleaned to remove contaminants deposited during the functionalization reaction. For example, the contaminants may comprise organic compounds originating from the precursor 108. In the case of organic precursors, the contaminants may be reacted with UV generated ozone to produce volatile compounds which may be flushed from the reaction chamber 126.

The functionalization process may not significantly increase the surface roughness of the substrate 104. In an example embodiment, an ITO substrate was functionalized with chlorine. An atomic force microscope (AFM) was used to characterize the surface of a bare UV ozone treated ITO substrate and a chlorine-functionalized ITO substrate. The surface roughness, expressed in terms of the arithmetic mean value, $R_a$, was found to be 2.2 nm for the bare surface and 1.9 nm after being functionalized with a monolayer of chlorine atoms. It can be appreciated that the monolayer was not a perfect monolayer and there may be some variability in coverage and contamination.

Figure 4:
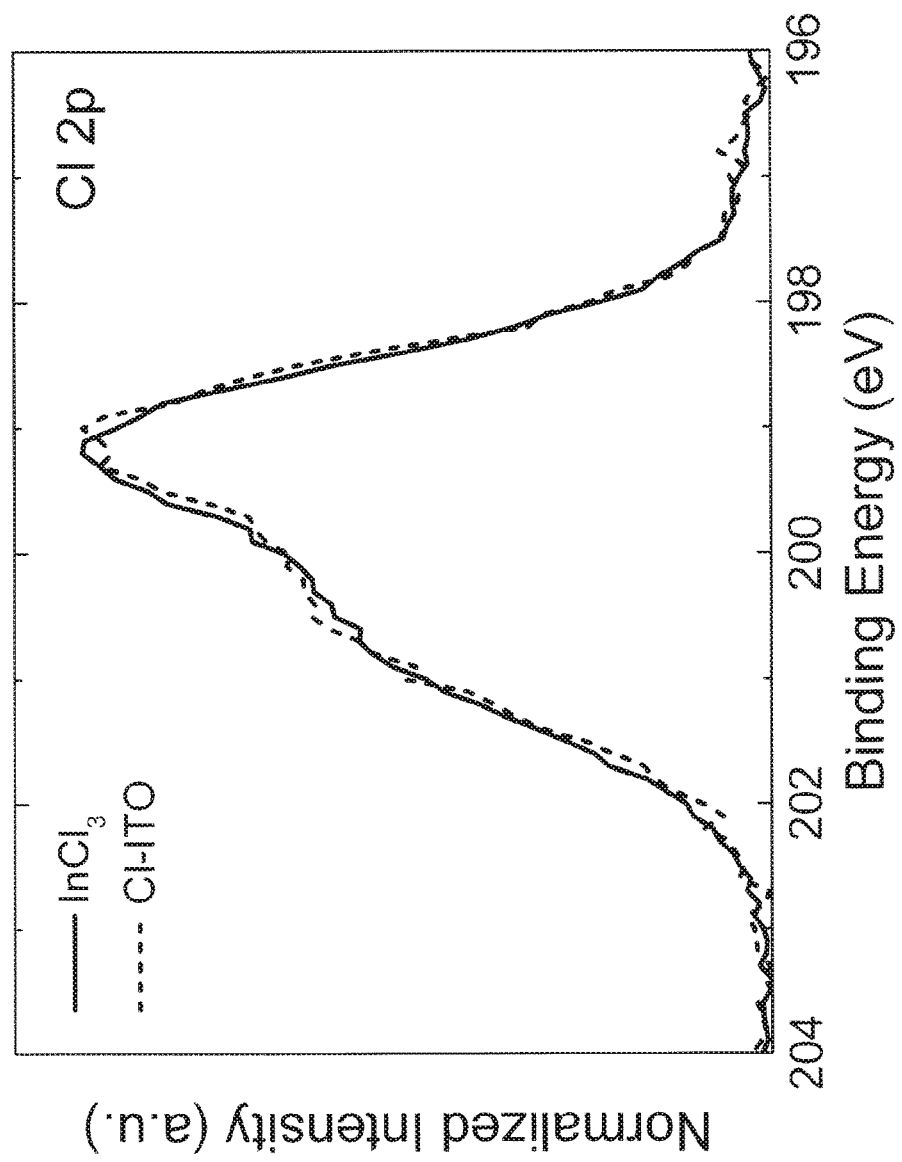
FIG. 4 is an X-Ray photoelectron spectroscopy graph showing that the bonding state of indium-chlorine bonds in $InCl_3$ is equivalent to the bonding state of indium-chlorine bonds in chlorine-functionalized ITO.

Referring now to FIG. 4, an XPS chart showing the 2p core-level energy spectrum of chlorine-functionalized ITO overlaid on the 2p core-level spectrum of an $InCl_3$ reference is provided. The similarities between the $InCl_3$ curve and the chlorine-functionalized ITO curve suggest that the indium-chlorine bonds on the surface of the functionalized ITO substrate are in the same chemical state as the indium-chlorine bonds in $InCl_3$.

Figure 5:
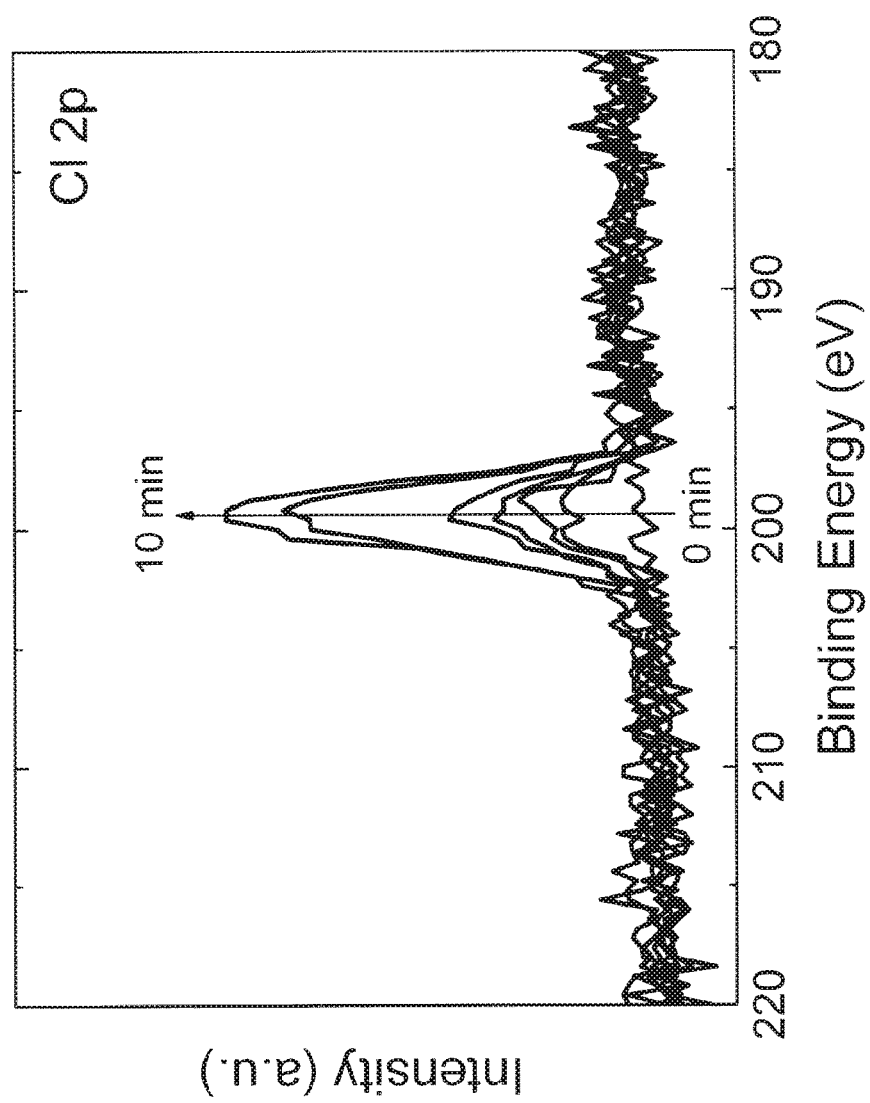
FIG. 5 is an X-Ray photoelectron spectroscopy graph showing the relationship between treatment time and chlorine functionalization of an ITO surface.

Turning now to FIG. 5, a chart of the approximate surface functionalization (as estimated by the 2p peak intensity of chlorine) with respect to reaction time is provided. Several ITO substrates were functionalized with chlorine using the EM radiation dissociation method. The duration of the functionalization reaction of each substrate was selected from between 0 and 10 minutes. XPS was used to measure the approximate surface coverage of chlorine on the functionalized substrates. As the reaction time of the functionalization process increases from 0 to 10 minutes, there is a proportional increase in the intensity of the 2p peak, demonstrating that the functionalization of substrate can be increased by increasing the reaction time. Conversely, with a shorter reaction time, the substrate is less functionalized, i.e., less than a monolayer is formed on the surface of the substrate. By selecting an appropriate duration of the functionalization reaction, the surface coverage may be tuned, for example, the surface coverage may be tuned to a predetermined fraction of a monolayer.

Figure 6:
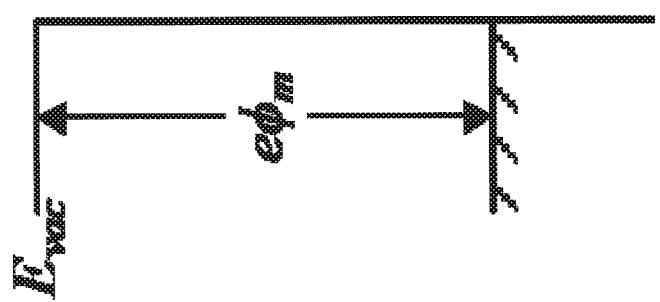
FIG. 6 is an energy level diagram illustrating the work function of an example ITO electrode.

FIG. 6 shows a band diagram of the work function of a standard ITO substrate with a bare surface. The work function of bare ITO is approximately 4.7 eV (5 eV after cleaning), which is significantly lower than the approximately 6 eV that is desired to efficiently inject holes from the anode into the light emitting layer of typical organic electronic devices.

Figure 7:
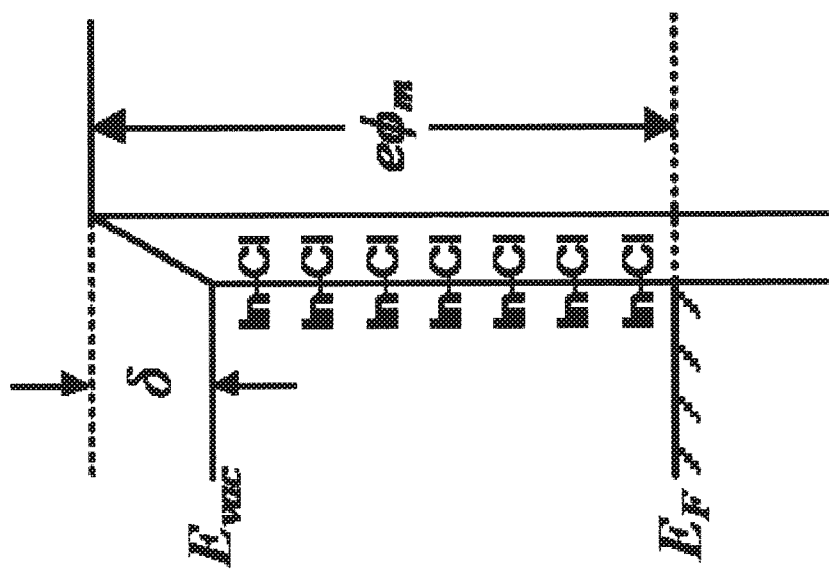
FIG. 7 is an energy level diagram illustrating the work function of an example chlorine-functionalized ITO electrode.

Turning now to FIG. 7, an energy level diagram is shown for an ITO substrate that has been functionalized with a monolayer of chlorine is provided. Each chlorine atom in the monolayer is chemically bonded to an indium atom in the ITO substrate, as was evidenced by the XPS chart of FIG. 4, above. The work function at the surface of the functionalized ITO electrode is significantly higher than the work function of bare UV ozone treated ITO. For example, the work function of ITO functionalized with a monolayer of chlorine may be approximately 6.1 eV in comparison with approximately ~5 eV for bare, UV ozone treated ITO.

The increase in work function of the chlorinated substrate with respect to the bare substrate may be attributable to the surface dipole induced by the chlorine atoms on the surface of the ITO. Therefore, functionalizing species increase the work function of the ITO in proportion to their dipole moment with the surface of the substrate. A desired increase in the work function of an electrode can be obtained by selecting an appropriate functionalization species. Surprisingly, as was described above, chlorine achieves the highest dipole despite being less electronegative than fluorine. Density functional theory calculations indicate that the In—Cl bond length is greater than the In—F bond length, resulting in a larger net dipole moment for chlorine in comparison with fluorine.

The work function of the TCO substrate may be tuned within a range by controlling the reaction time, for example, by interrupting or blocking radiation 114 from the radiation emitter 112. The concentration of the precursor compound may also be selected to tune the range. For example, by depositing less than a monolayer on the surface of a substrate, the work function may be set to be lower than the work function of a substrate that has been functionalized with a full monolayer of species but higher that of a bare substrate surface.

Figure 8:
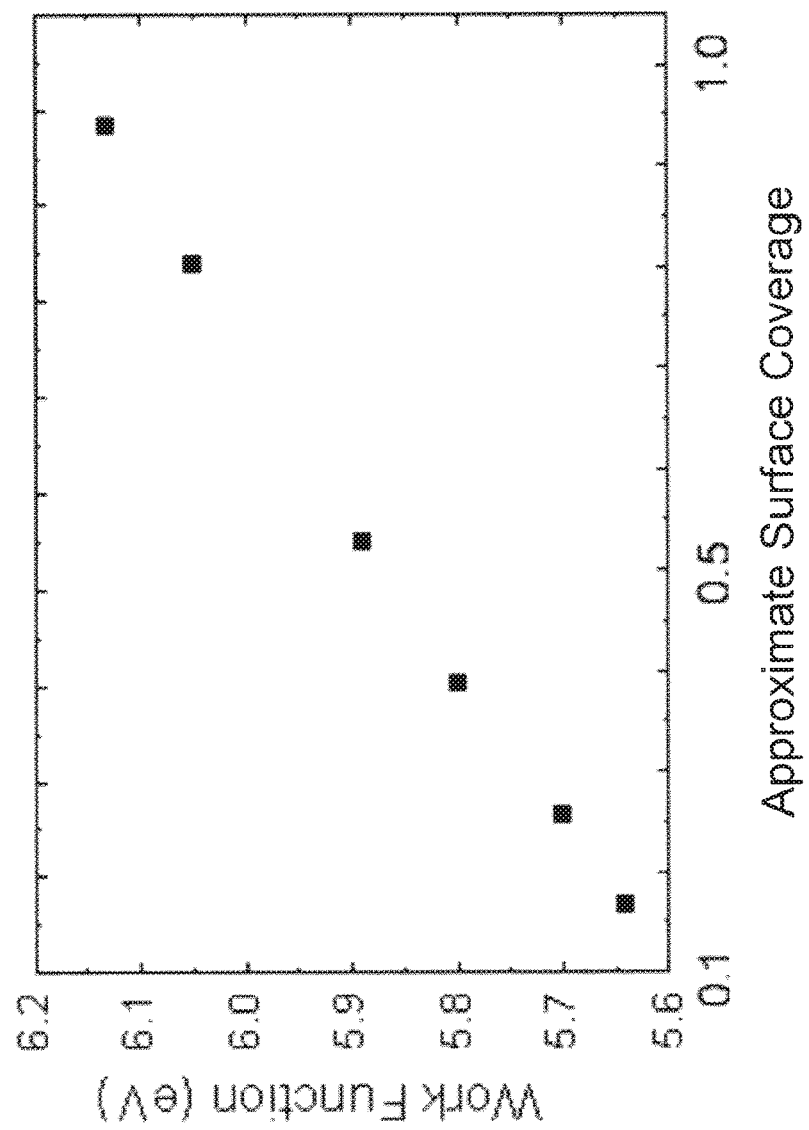
FIG. 8 is a representative chart showing the relationship between the approximate surface coverage of chlorine on an ITO substrate and the work function of the ITO substrate.

Referring to FIG. 8, a chart illustrating the relationship between work function and surface coverage of chlorine on an ITO substrate as approximated from the chlorine 2p core-level XPS results is provided. The work function is approximately linearly related to the surface functionalization of the ITO substrate. It will be appreciated that the chart of FIG. 8 is a rough approximation and is a representation of the relationship only.

By way of example, a functionalization of about 15% of a monolayer corresponds to a work function of approximately 5.65 eV. A functionalization of approximately 95% of a monolayer corresponds to a work function of approximately 6.15 eV. Hence, the work function may be tuned depending on the application by functionalizing the surface with up to a monolayer. When a higher work function is desired, for example, above 6.1 eV, the surface may be functionalized with about a monolayer of chlorine. As stated above, it will be appreciated that the monolayer, or portions of the monolayer, may be imperfect.

In the context of OLEDs, ITO is commonly used as an anode. The work function of a functionalized ITO anode may be tuned to match the HOMO level of the organic hole transporting material, as is further described below.

Figure 9:
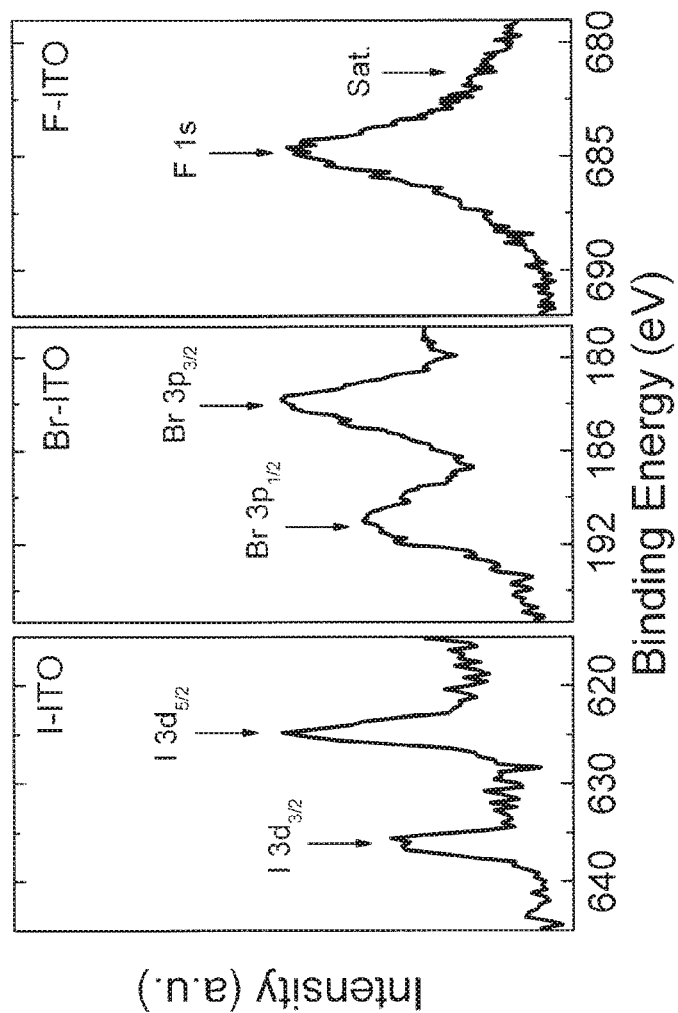
FIG. 9 is an X-ray photoelectron spectroscopy graph comparing the binding energy of various halogen-functionalized substrates.

Referring to FIG. 9, XPS core-level spectra of ITO functionalized with iodine, bromine, and fluorine are provided. As was described above, chlorine induces the largest dipoles in the halogen-indium bond on a functionalized ITO surface, thereby providing the maximum increase in work function relative to ITO functionalized with other halogens.

As can be seen in Table 1 below, the functionalization of various TCO surfaces is possible. UPS refers to ultraviolet photoelectron spectroscopy.

TABLE 2

Experimental work function from XPS/UPS of Various Functionalized Substrates

| Substrate | Functionalized Species | Work Function of Clean Substrate [eV] | Work Function of Functionalized Substrate [eV] |
|---|---|---|---|
| ITO | chlorine | 4.7 | 6.1 |
| FTO | fluorine | 4.9 | 5.6 |
| ZnO | chlorine | 4.7 | 5.3 |
| Au | chlorine | 5.2 | 6.2 |

Figure 10:
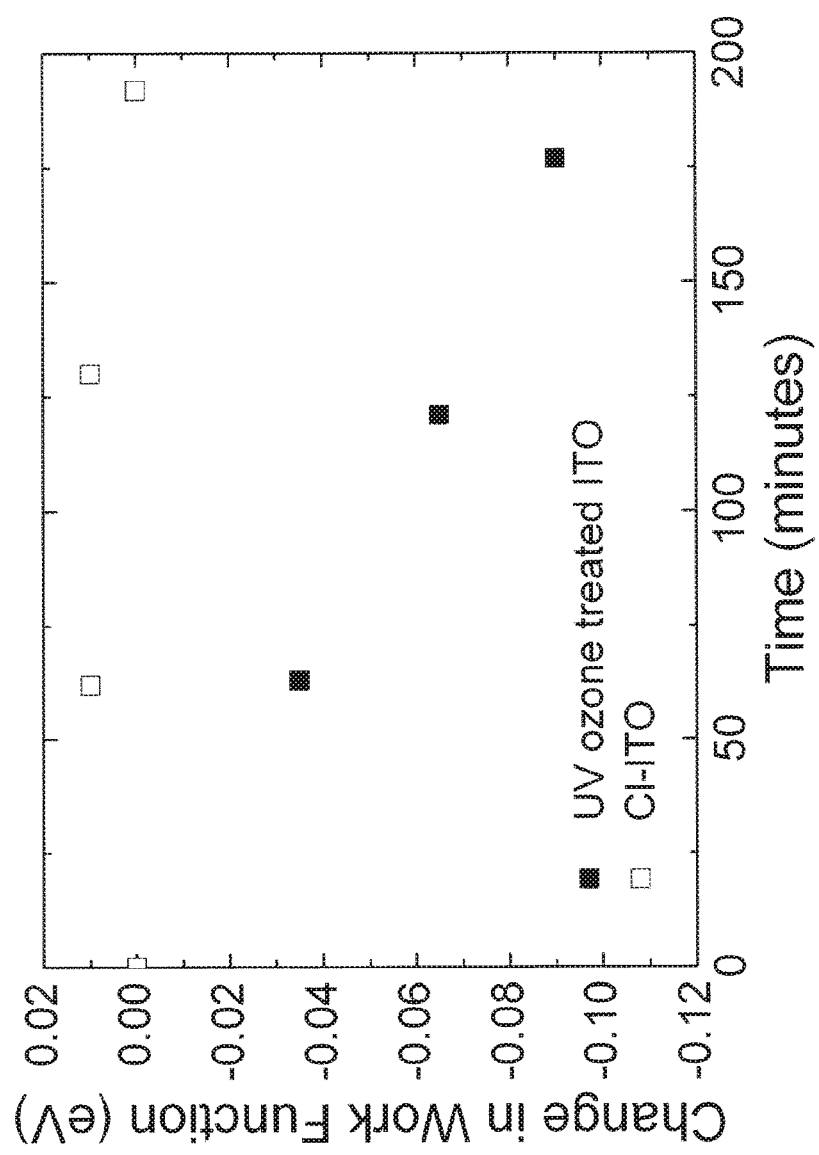
FIG. 10 is a representative chart contrasting the change in work function over time in air for a chlorine functionalized ITO substrate and a bare ITO substrate.

In addition to increasing the work function of the electrode, halogen functionalization increases the stability of the work function of the electrode relative to that of a bare UV ozone or $O_2$ plasma treated TCO electrode. Turning to FIG. 10, a chart showing the stability of the work function of an ITO substrate functionalized with a monolayer of chlorine is compared with a bare ITO substrate in the presence of air. The surface of the bare substrate was treated with UV ozone for 15 minutes. As can be seen from FIG. 10, the work function of the bare electrode drops by approximately 0.1 eV over about three hours in the presence of air. In contrast, there is no substantial change in the work function of the functionalized substrate. This demonstrates the increased stability provided to functionalized substrates. This may be advantageous in a production environment, as a functionalized substrate may be left in atmospheric conditions for a period of time without impacting the work function of the substrate. Higher stability may enable substrates to be stored in air, rather than in a vacuum or under an inert gas. The stability of the functionalized substrate depends on the ambient environment including the ambient temperature and humidity.

Turning to FIG. 11, a table is provided showing the work function of various substrates after being exposed to air for a period. It can be appreciated that under the same conditions and after exposure to air, the work function of the functionalized substrate is substantially higher than the work function of the bare substrate under the same conditions.

Figure 12:
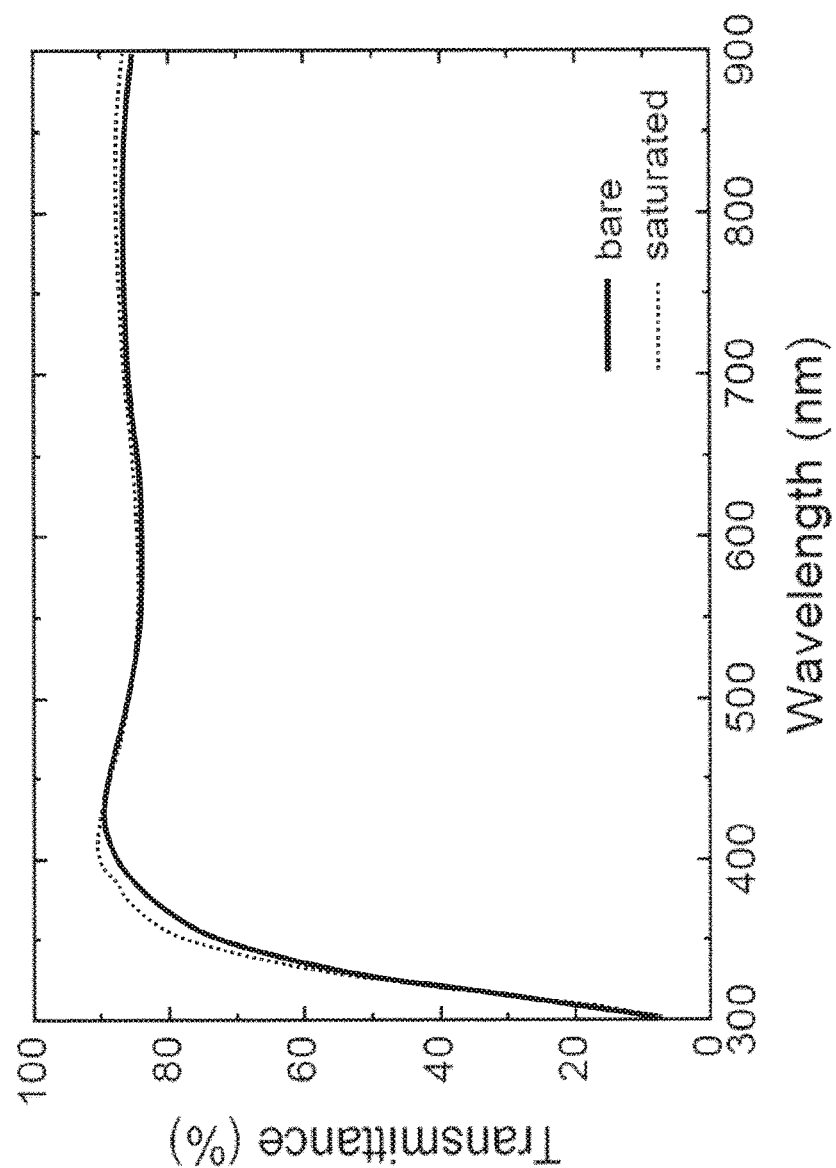
FIG. 12 is a chart comparing the transmittance of chlorine-functionalized ITO on a glass substrate to the transmittance of a bare ITO electrode on the same glass substrate.

Referring now to FIG. 12, a chart is provided to illustrate that the transmittance characteristics of a chlorine-functionalized ITO substrate are not substantially inferior to the transmittance characteristics of a bare ITO substrate. The ITO layers were deposited on transparent substrates. As can be seen from the chart, the transmittance curves are very similar over a wide range of wavelengths. Importantly, the curves are almost indistinguishable over the visible spectrum, illustrating that a chlorine-functionalized ITO anode may be used in an organic optoelectronic device with no increase in the attenuation of light transmitted through the anode relative to that of a bare ITO anode.

Figure 13:
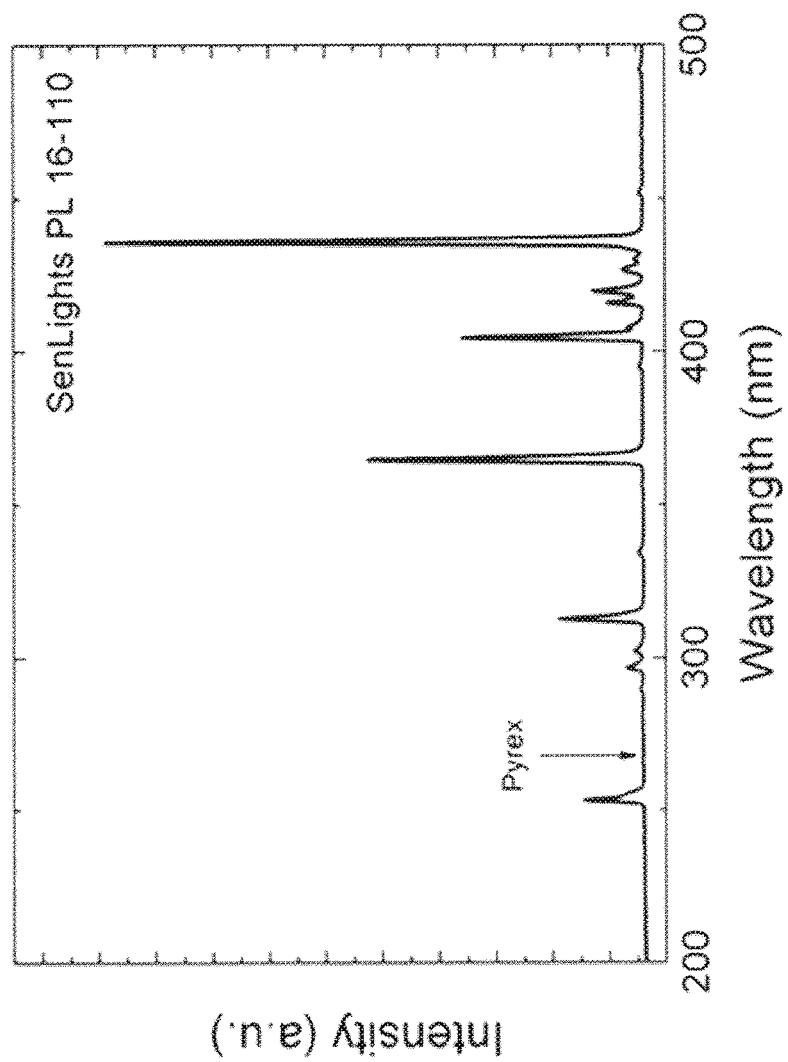
FIG. 13 is a chart showing a spectrum of the ultraviolet radiation emitter.

Turning to FIG. 13, a spectrum of the ultraviolet lamp used to functionalize the ITO substrates in the examples above is provided. Specifically, the spectrum corresponds to that of a PL16-110 Photo Surface Processing Chamber (Sen Lights™). The wavelength corresponding to the cut-off wavelength of Pyrex™ glass, which may be used as a reaction chamber, is also provided.

The conductivity of a chlorine-functionalized ITO substrate is also not substantially inferior to the conductivity of a bare ITO substrate. As measured with a 4-point probe the sheet resistance of an example chlorine-functionalized ITO substrate is 18.2 Ohms per square, compared to 18.1 Ohms per square for a bare ITO substrate.

One application of a transparent conducting substrate, for example, an ITO substrate that has been functionalized to have a high work function, is the use of the substrate in an organic electronic device. Functionalizing the surface of an ITO substrate with a halogen species to increase the work function of the ITO substrate can reduce the hole injection barrier. Reducing the hole injection barrier improves the efficiency of hole injection in an OLED, thereby decreasing the amount of voltage required to induce a current in the device.

It will be appreciated that although a functionalized TCO substrate is shown in an example OLED construction, other OLED constructions may use functionalized TCO substrates. Furthermore, other types of electronic devices may comprise functionalized TCO substrates.

Figure 14:
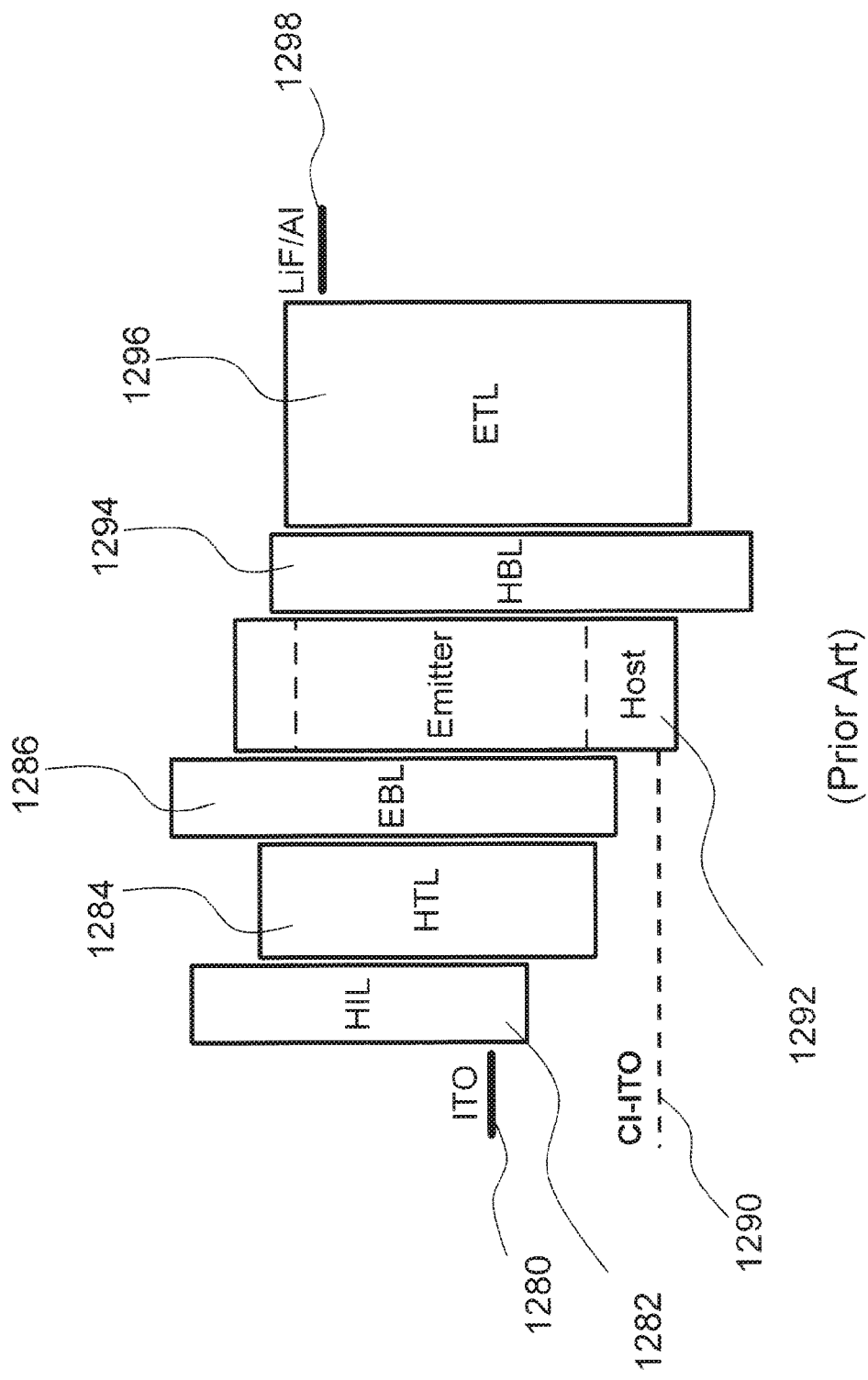
FIG. 14 is an energy level diagram of an example phosphorescent green OLED construction comprising a bare ITO anode.

FIG. 14 shows an example energy diagram of an embodiment of an OLED using a transparent conducting substrate from the prior art. An ITO layer 1280 is typically formed on a transparent substrate used as the anode. Holes are injected from the anode 1280 into a hole injection layer (HIL) 1282, then to a hole transport layer (HTL) 1284, through an electron blocking layer (EBL) 1286 and into to the light emitting thin film layer 1292. Concurrently, electrons are injected via the cathode 1298 and are transported through the electron transport layer (ETL) 1296, through the hole blocking layer (HBL) 1294, and recombine with holes in the light emitting thin film layer to release photons. The photons emitted in the thin film layer may then escape through ITO layer 1280 and any transparent substrate supporting the ITO layer 1280. A ghost line 1290 is provided to show the relative work function of a chlorine-functionalized ITO layer, which is significantly better aligned with the emitting layer.

Figure 15:
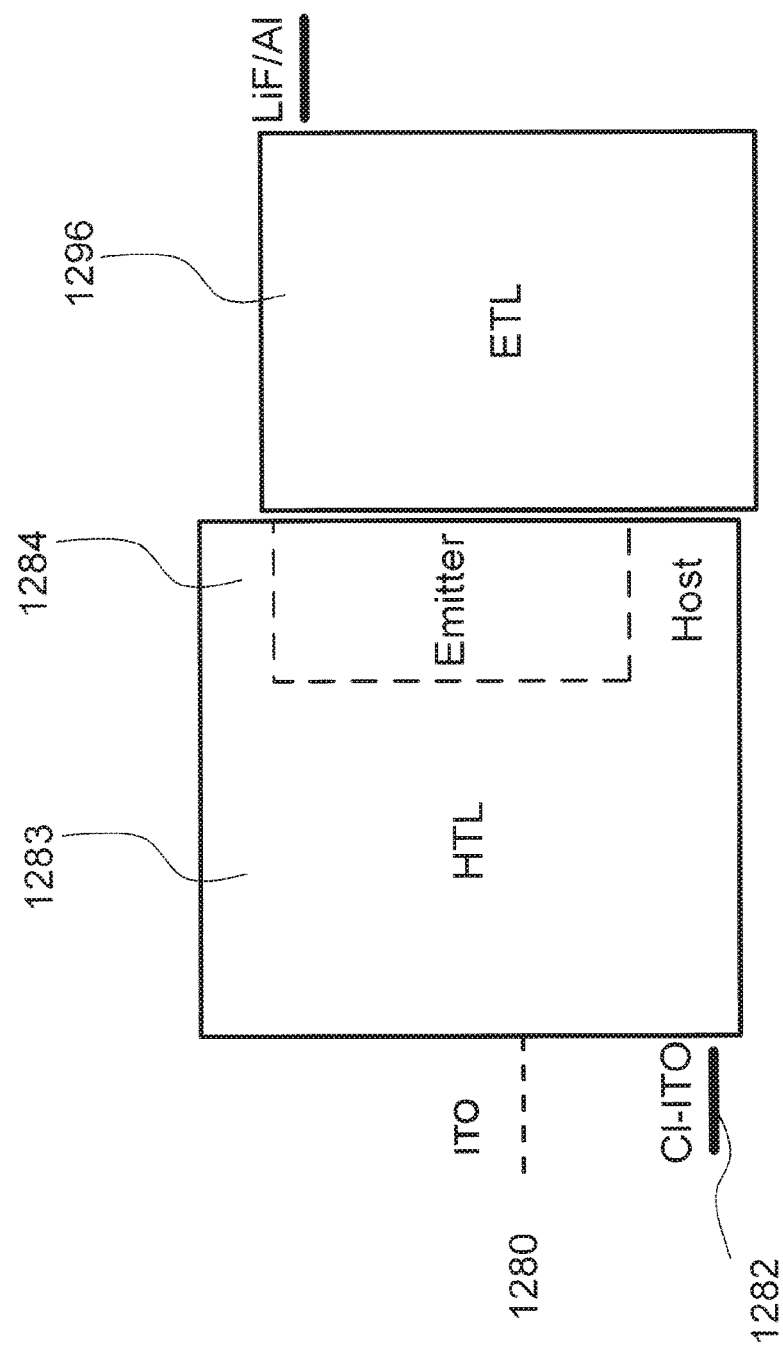
FIG. 15 is an energy level diagram of an example phosphorescent green OLED construction comprising a chlorinated ITO anode.

FIG. 15 is an energy level diagram for a simplified phosphorescent OLED comprising a chlorine functionalized ITO electrode 1380. At lower barrier heights, holes can be injected more efficiently from the anode. As can be seen from the diagram, the height of the hole injection barrier, which is dependent on the difference between the HOMO of the emitting layer and the work function of the ITO electrode 1380, is relatively low for the chlorine functionalized electrode. This lower hole injection barrier enables the electrode to inject directly into the host 1284, thereby enabling the host and the HTL 1283 to be the same material. Since the chlorine-functionalized anode is closely aligned with the HOMO level of the HTL 1283, there is no need for the HIL layer 1282. In contrast, a bare ITO electrode 1280 has a high injection barrier, making it inefficient to inject holes without the intermediate HIL, as was shown in FIG. 14. If the HTL and ETL are selected to have appropriate energy levels, as understood by one skilled in the art, the EBL and HBL may also be eliminated.

Figure 16:
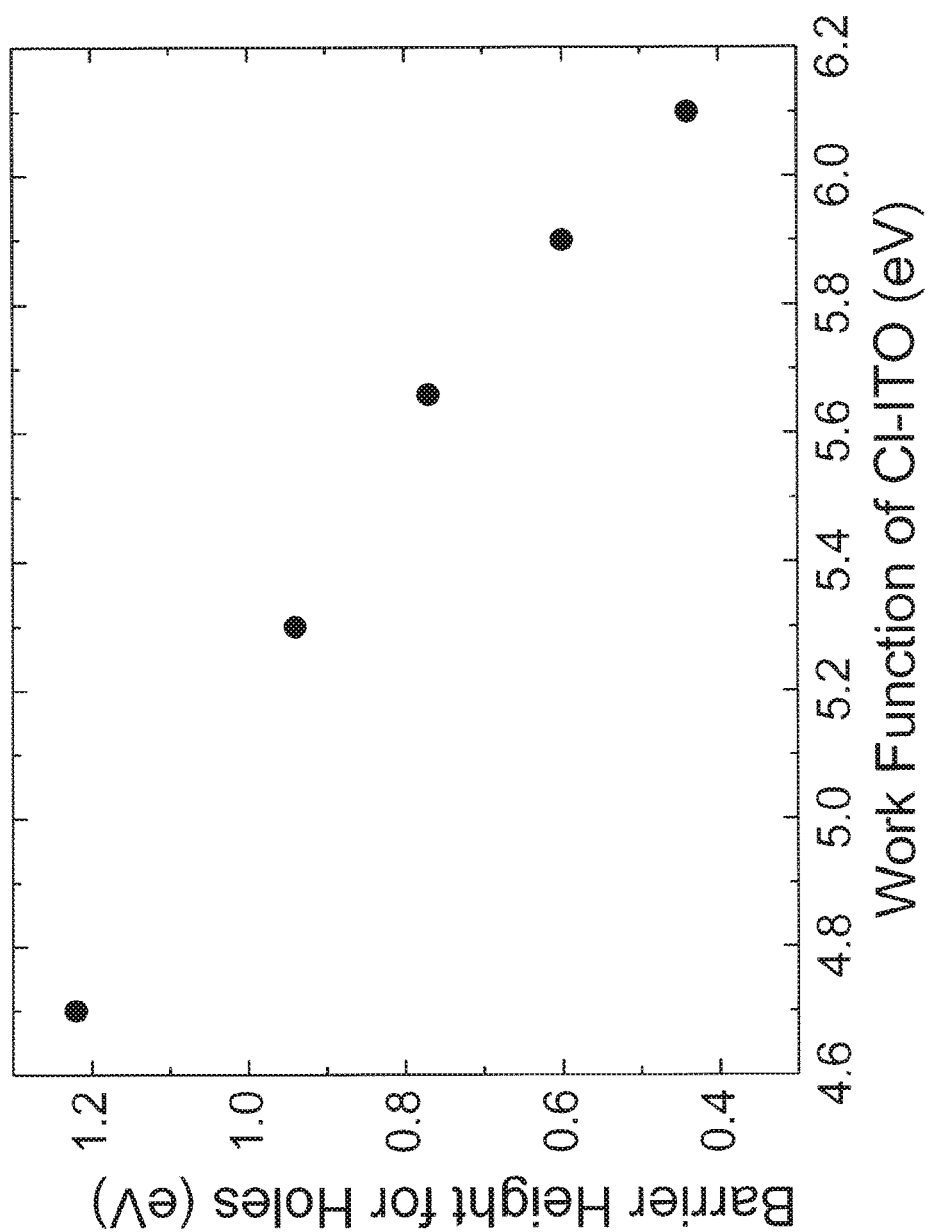
FIG. 16 is a representative chart showing the relationship between the work function of a chlorine functionalized surface and the hole injection barrier height into a hole transport layer.

Referring now to FIG. 16, a UPS chart showing the relationship between the work function of the anode and the barrier height for holes in an OLED device is provided. It can be seen that increasing the work function of the electrode using halogen functionalization reduces the hole injection barrier height.

In an example embodiment, a chlorine-functionalized ITO anode was prepared for use in a phosphorescent green bottom emitting OLED. An OLED comprising a chlorine-functionalized ITO anode and another OLED comprising a bare UV ozone treated ITO anode were fabricated in a Kurt J. Lesker LUMINOS™ cluster tool with a base pressure of $10^{-8}$ Torr on commercially patterned ITO coated glass (25 mm×25 mm). ITO substrates were ultrasonically cleaned with a standard regiment of Alconox™ dissolved in deionized (DI) water, acetone, and methanol. The ITO substrates were then treated using UV ozone treatment for 3 minutes in a PL16-110 Photo Surface Processing Chamber (Sen Lights).

Chlorine-functionalized ITO was prepared by functionalizing the surface of the ITO substrate for 10 minutes according to the method described in FIG. 1 and in a Pyrex™ Petri dish with 0.2 ml 1,2-dichlorobenzene as the precursor compound. A Pyrex™ reservoir was used as the chamber and the UV source was located outside of the chamber. A transmission spectrum of Pyrex™ is provided in FIG. 24a and the spectrum of the UV lamp is provided in FIG. 24b. Once the functionalization reaction was complete, the ITO substrate was treated in UV ozone for 3 minutes.

The organic layers and the LiF cathode were thermally deposited from alumina crucibles in dedicated organic chamber. The Al layer was deposited in a separate dedicated metal deposition chamber from a boron nitride crucible without breaking vacuum. All layers were patterned using stainless steel shadow masks to define the device structure. The active area for all devices was 2 mm². The standard device structure is as follows: anode/CBP (35 nm)/CBP:Ir(ppy)$_2$(acac) (15 nm, 8%)/TPBi (65 nm)/LiF (1 nm)/Al (100 nm), where Ir(ppy)$_2$(acac) is bis(2-phenylpyridine) (acetylacetonate)iridium(III), and TPBi is 2,2',2"-(1,3,5-benzinetriyl)-tris(1-phenyl-1-H-benzimidazole).

Figure 17:
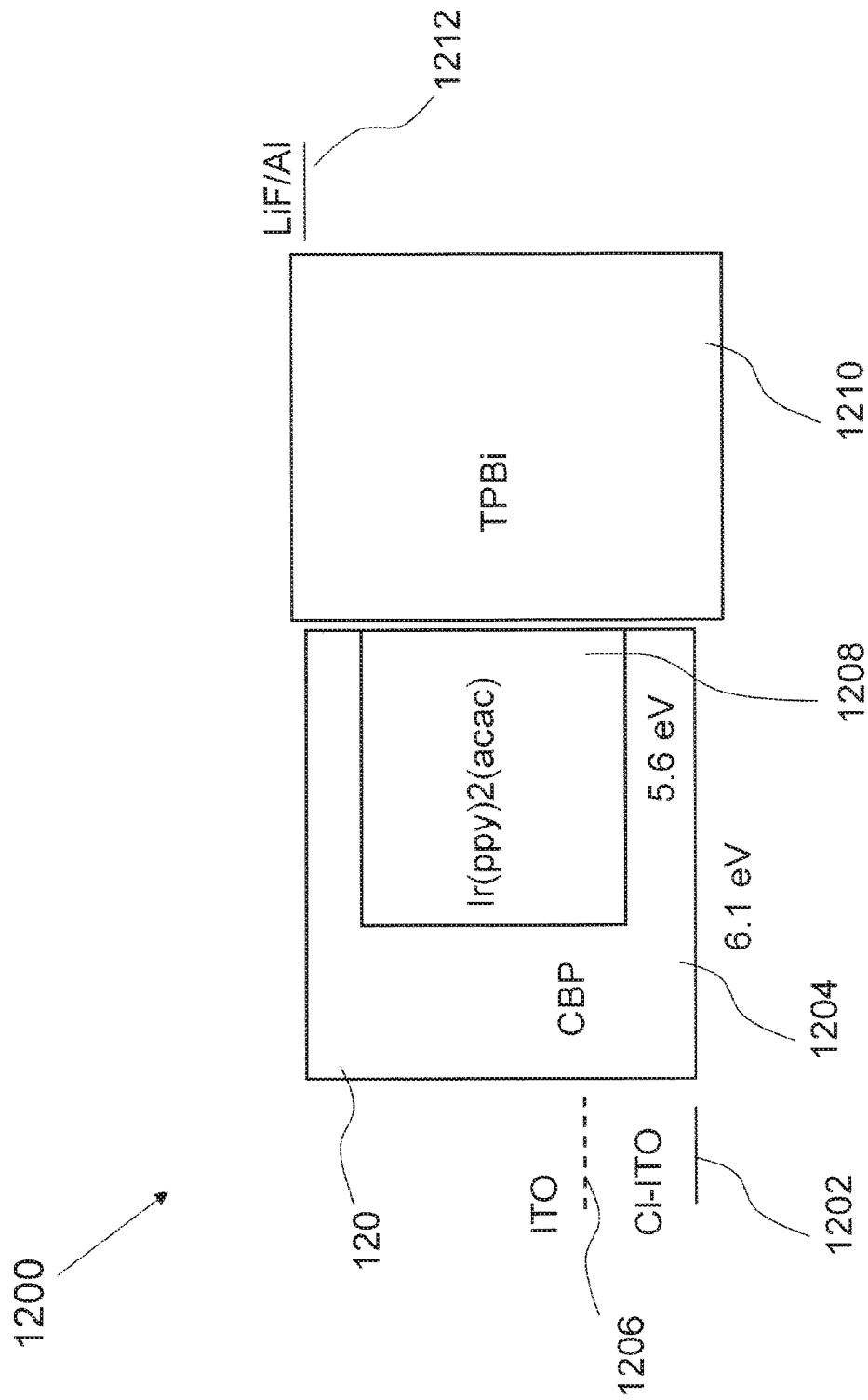
FIG. 17 is an energy level diagram of an example phosphorescent green OLED comprising a chlorine-functionalized anode.

An energy level diagram 1200 of the example phosphorescent OLED structure is provided in FIG. 17. The chlorine-functionalized ITO anode 1202 has a significantly higher work function than a bare UV ozone treated ITO anode 1206. Hence, the chlorine-functionalized anode is better able to inject holes into the CBP layer 1204, as the HOMO level of the CBP layer 1204 is well aligned with the work function of the chlorine-functionalized ITO anode. The Ir(ppy)2(acac) layer 1208 may be doped into the CBP layer 1204. The TPBi layer 1210 is in electrical communication with the LiF/Al cathode layer 1212 and the Ir(ppy)2(acac) layer 1208.

Figure 18:
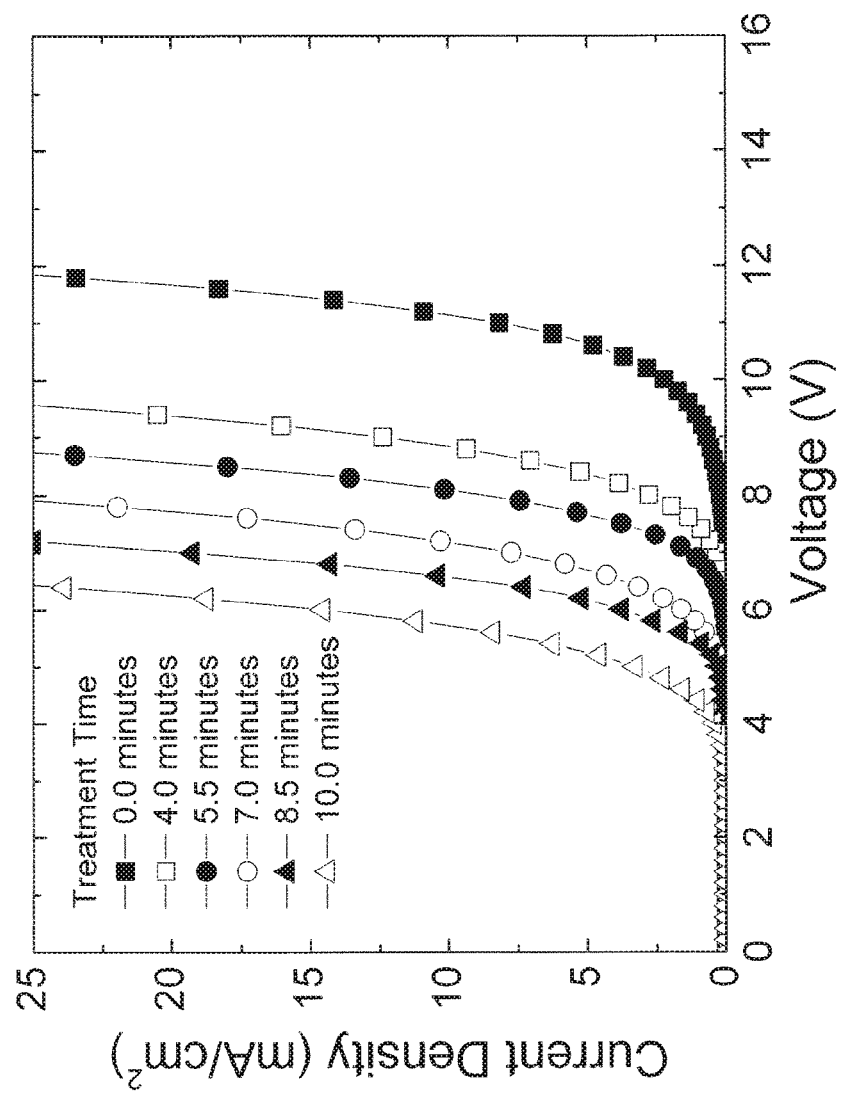
FIG. 18 is a current-voltage chart showing a reduction in required driving voltage with increasing surface chlorination of an ITO anode.

FIG. 18 is a diagram showing the current-voltage characteristics of the example device of FIG. 17. As can be seen, as the treatment time increases to a point where a monolayer is formed, the voltage required to drive current decreases. Hence, if a monolayer of chlorine is functionalized to the surface of the ITO anode used in the example OLED device, the voltage required to operate the OLED may be significantly reduced. As can be seen from FIG. 18, the voltage may be reduced by approximately 4 V at an equivalent current density.

Figure 19:
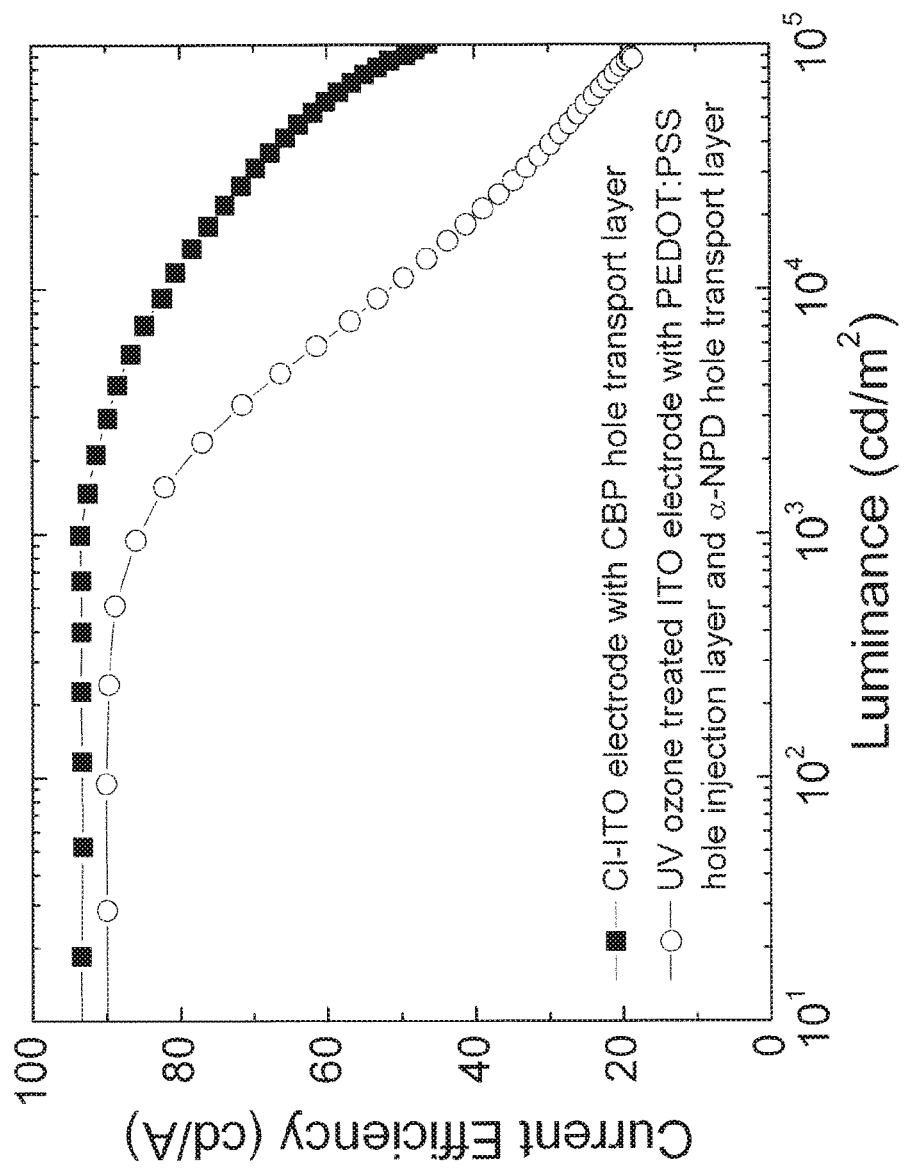
FIG. 19 is a chart showing the relationship between current efficiency and luminance of the OLED of FIG. 17 comprising an anode with a monolayer of chlorine.

FIG. 19 is a chart of the current efficiency of the example OLED device of FIG. 17 comprising a chlorine-functionalized anode with respect to the luminance being output from an OLED reference device from the prior art. Specifically, the OLED device comprises a UV ozone treated anode with the structure: anode/PEDOT:PSS (5 nm)/α-NPD (35 nm)/CBP:Ir(ppy)$_2$(acac) (15 nm, 8%)/TPBi (65 nm)/LiF (1 nm)/Al (100 nm), where α-NPD is N,N'-bis(naphthalen-1-yl)-N,N'-bis(phenyl)-benzidine. It will be appreciated that the PEDOT:PSS (5 nm)/α-NPD (35 nm) layers in the reference device are required to inject holes into the CBP:Ir(ppy)$_2$(acac) emission layer from the bar UV ozone treated ITO anode. It can be seen from FIG. 19 that the chlorine-functionalized anode increases the current efficiency with respect to the reference OLED comprising a bare UV ozone treated electrode. In particular, at high luminance, the OLED comprising the functionalized anode is significantly more efficient.

Figure 20:
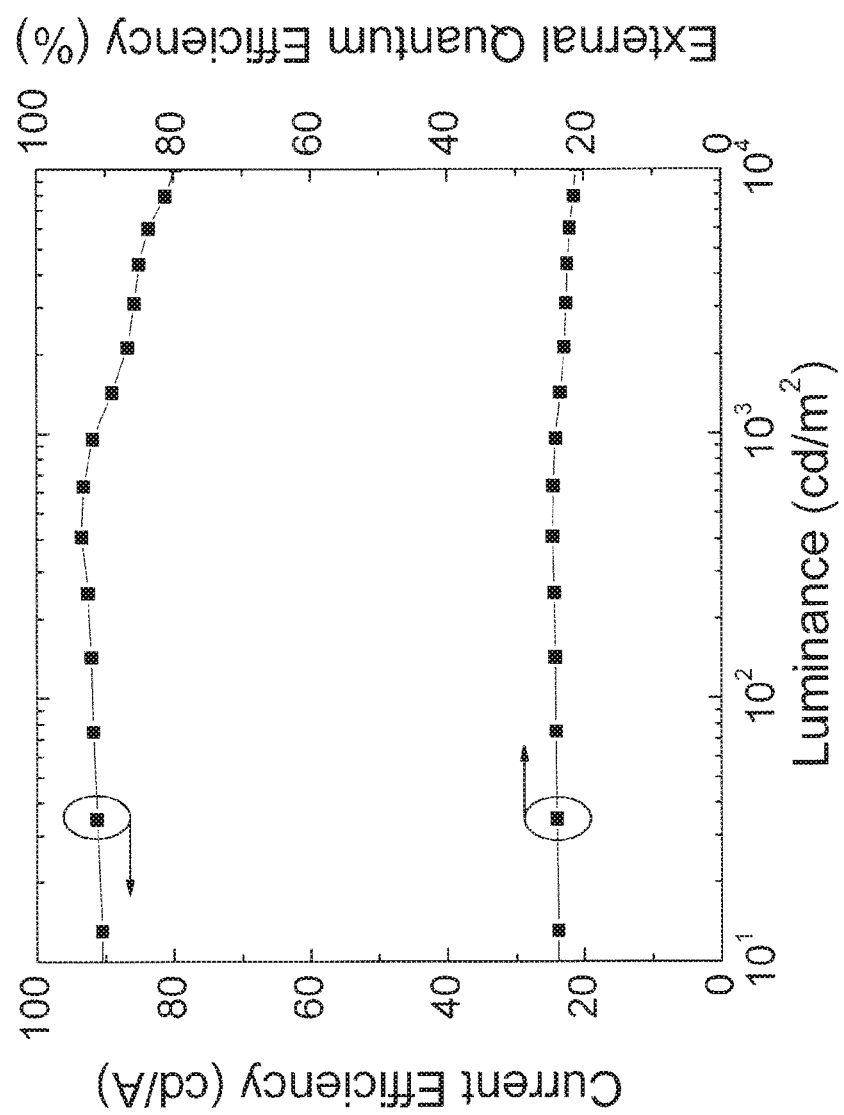
FIG. 20 is a diagram showing the efficiency of the OLED of FIG. 17 comprising a monolayer of chlorine on the ITO anode.

Turning to FIG. 20, the current efficiency and external quantum efficiency (EQE) of the phosphorescent OLEDs comprising a chlorine functionalized anode is provided. The phosphorescent OLED has a high maximum current efficiency of 93.5 cd/A at 400 cd/m$^2$, which corresponds to a maximum EQE of 24.7%. At 10,000 cd/m$^2$ the current efficiency and EQE are still relatively high at 79.6 cd/A and 21% respectively. Turning to FIG. 21, the example OLED of FIG. 17 comprising a chlorinated ITO anode is compared with devices constructed using methods found in the prior art. As can be seen, the OLED comprising the chlorine-functionalized anode may be constructed to be significantly more simple in terms of device layers and materials and may further exhibit a significantly higher external quantum efficiency.

Figure 22:
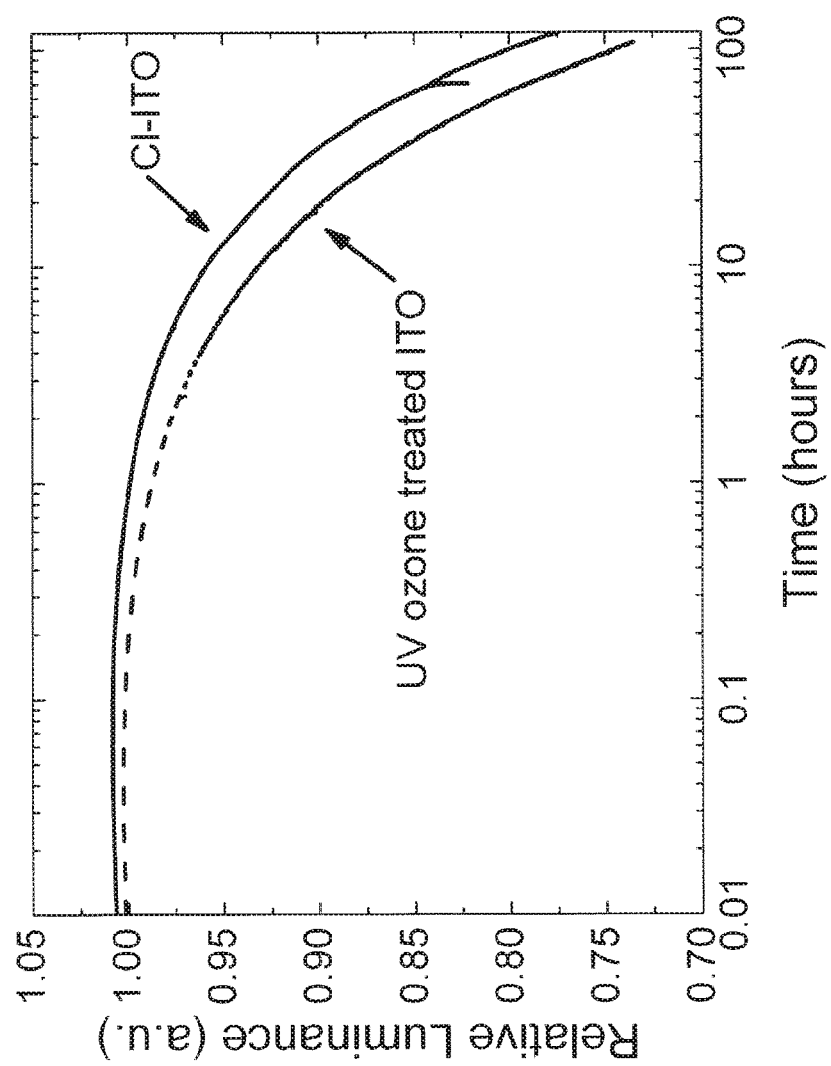
FIG. 22 is a chart showing the change in luminance over time for an OLED comprising a chlorine functionalized anode.

Referring now to FIG. 22, a chart is provided showing the change in luminance measured in vacuum for the example OLED with the structure: electrode/CuPc (25 nm)/α-NPD (45 nm)/CBP:Ir(ppy)$_2$(acac) (15 nm, 8%)/TPBi (10 nm)/Alq$_3$ (45 nm)/LiF (1 nm)/Al (100 nm), where CuPc is copper phthalocyanine. As can be seen, the luminance of an OLED comprising an ITO anode that has been functionalized with chlorine is higher than an OLED comprising a bare UV ozone treated ITO anode after being in operation for several hours. This demonstrates that the OLED comprising an ITO anode maintains a relatively higher luminance over time.

In another example embodiment, a fluorescent green OLED was fabricated following the same procedure as for the phosphorescent OLED outlined above. The standard device structure of the OLED is as follows: anode/CBP (50 nm)/Alq$_3$:C545T (30 nm, 1%)/Alq$_3$ (15 nm)/LiF (1 nm)/Al (100 nm), where CBP is 4,4'-bis(carbazol-9-yl)biphenyl, Alq$_3$ is tris(8-hydroxy-quinolinato)aluminium, and C545T is 2,3,6,7-tetrahydro-1,1,7,7,-tetramethyl-1H, 5H,11H-10-(2-benzothiazolyl)quinolizino[9,9a, 1gh]coumarin.

Figure 23:
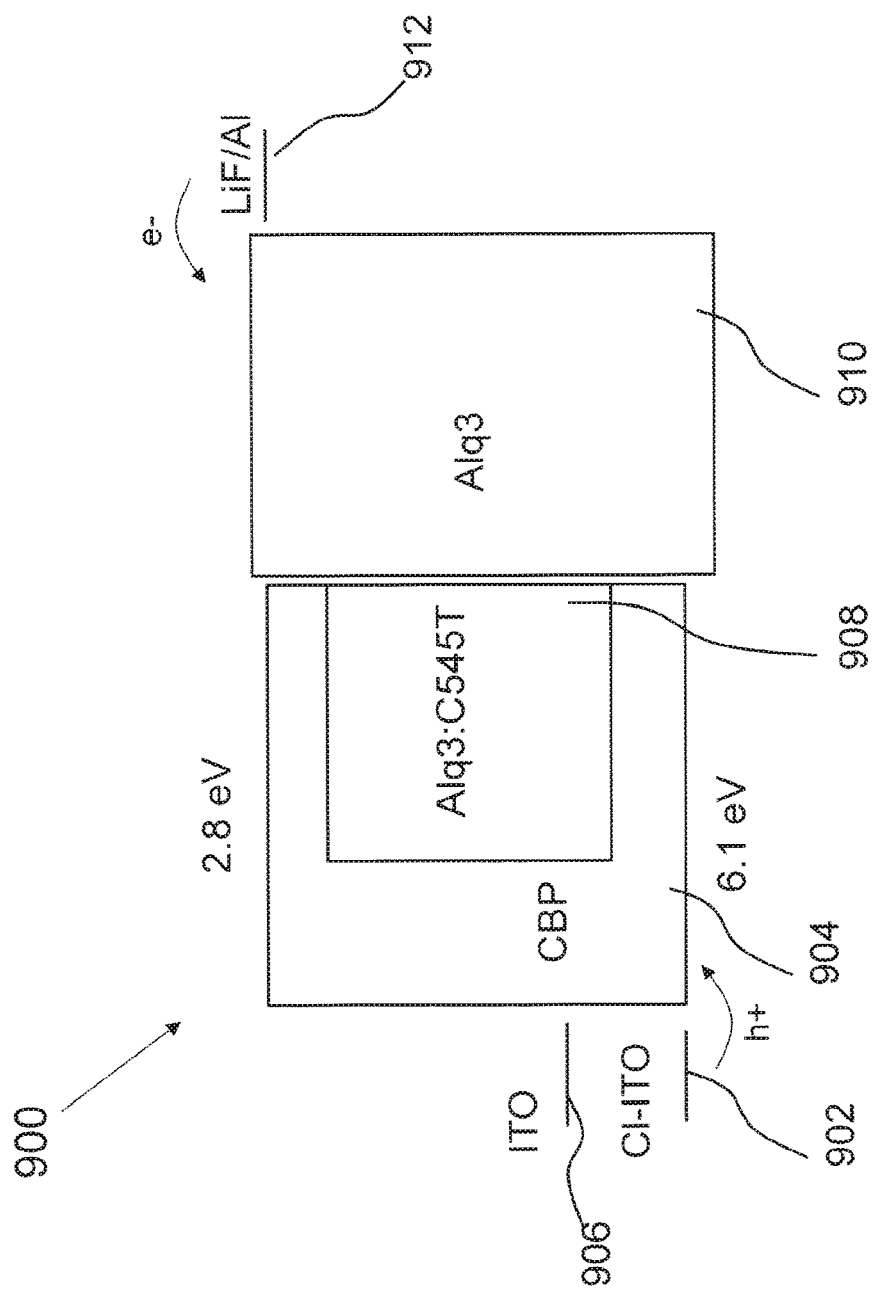
FIG. 23 is an energy level diagram of an example fluorescent green OLED.

An energy level diagram 900 of the fluorescent OLED structure is provided in FIG. 23. Numeral 902 refers to the chlorine-functionalized ITO anode, which has a significantly higher work function than the bare ITO anode 906. Hence, the chlorine-functionalized anode 902 is better able to inject holes into the CBP 904, as the HOMO level of the CBP 904 is well aligned with the work function of the chlorine functionalized ITO anode 902. The OLED further comprises an Alq$_3$:C545T layer 908 and an Alq$_3$ layer 910, which is in communication with the LiF/Al cathode 912.

The HOMO level of the CBP layer in contact with the anode is approximately 6.1 eV. The work function of the functionalized anode is approximately 6.1 eV and the work function of the bare anode is approximately 5.0 eV, after being treated with ozone, as measured by ultraviolet photoelectron spectroscopy (UPS). The work function of the bare anode is too low to efficiently inject holes into the OLED whereas the work function of the functionalized anode is more aligned with the HOMO level of the CBP layer.

Figure 24:
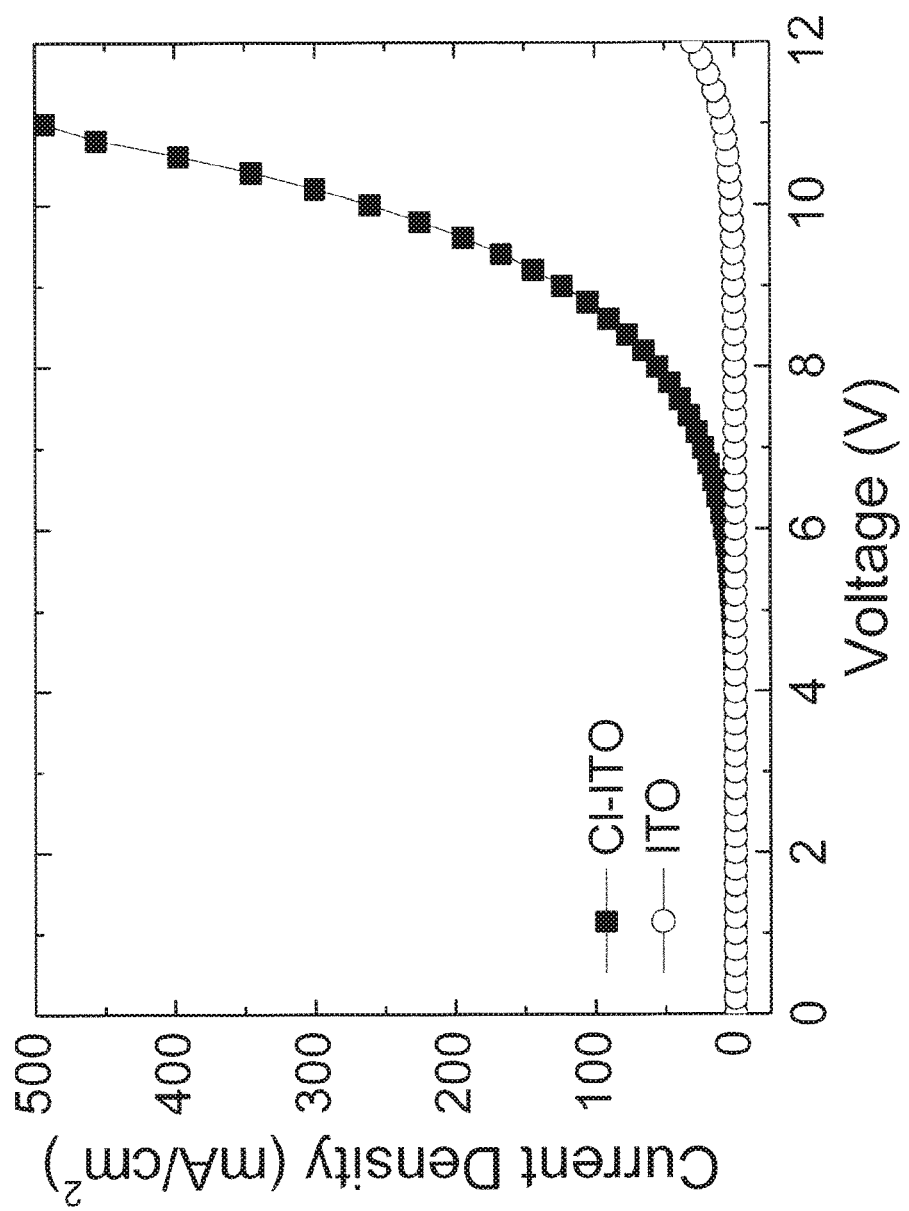
FIG. 24 is a diagram showing the current-voltage characteristics of an example fluorescent green OLED comprising a chlorine-functionalized ITO anode.

FIG. 24 is a chart showing the current-voltage characteristics of a fluorescent green OLED comprising a chlorine-functionalized ITO anode with respect to a fluorescent green OLED of identical construction comprising a bare UV ozone treated ITO anode. As can be seen from FIG. 24, the voltage required to achieve a particular current density is significantly lower for the OLED comprising the chlorine-functionalized anode.

Specifically, the current density of the OLED device comprising the functionalized electrode dramatically increases with a driving voltage of more than 6 volts. At 10 volts, the current density of the OLED comprising the chlorine-functionalized ITO anode is approximately 300 mA/cm$^2$. In contrast, the current density of the OLED comprising the bare ITO electrode is insignificant. The higher current density of the OLED comprising the chlorine-functionalized ITO anode demonstrates that the higher work function enables more efficient injection of holes into organic hole transporting materials with deep HOMO levels.

Figure 25:
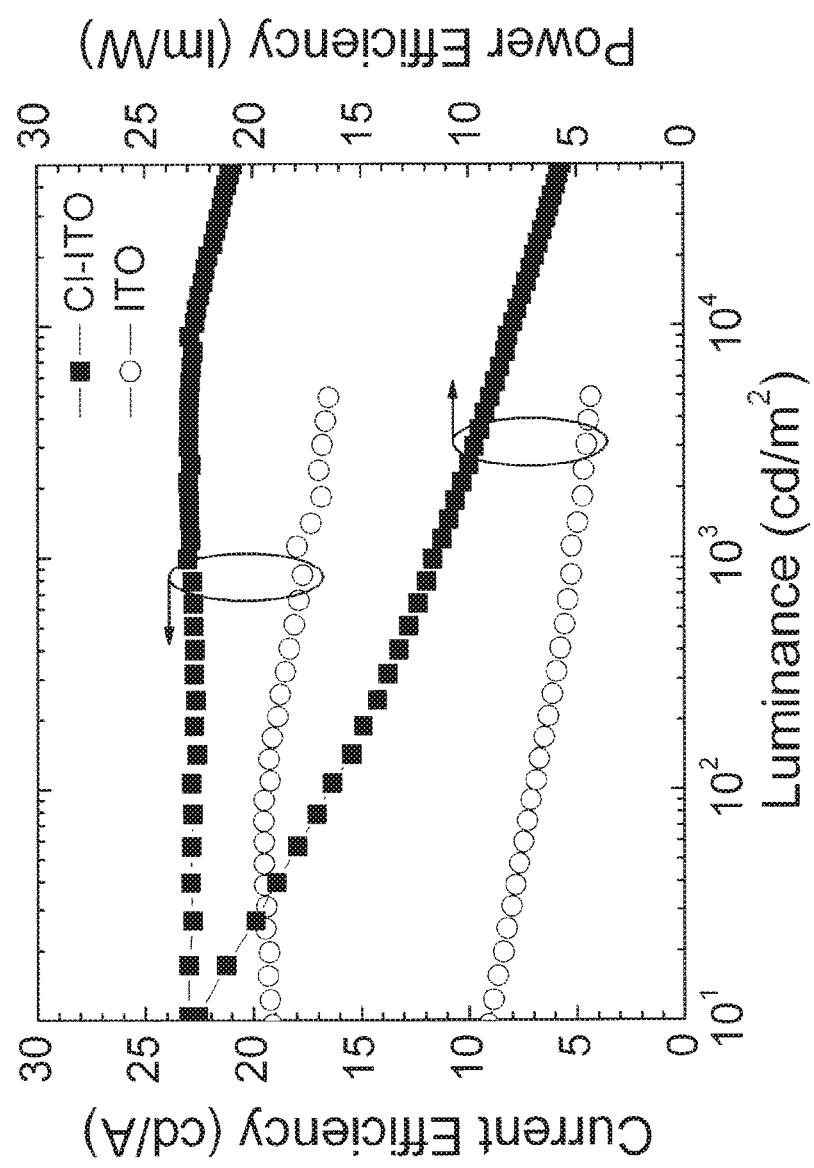
FIG. 25 is a diagram showing the efficiency of an example fluorescent green OLED comprising a chlorine-functionalized ITO anode.

A major advantage of aligning the work function of the ITO anode with the HOMO of the CBP layer is that the power efficiency of the OLED is increased; that is to say, the light output per unit of electrical input in increased. Referring to FIG. 25, a chart showing the current and power efficiencies of the OLED devices discussed above is provided. The device with bare ITO anode has a lower power efficiency and a lower current efficiency due to the poor injection of holes from bare ITO anode into the deep 6.1 eV HOMO of CBP. The device with chlorine-functionalized ITO anode has a much higher efficiency, with a maximum current efficiency at a luminance of approximately 1000 cd/m$^2$ of 23 cd/A versus the approximately 18cd/A for the bare ITO anode.

Similarly, the power efficiency of the OLED comprising a chlorine-functionalized ITO anode is approximately 12 lm/W at a luminance of 1000 cd/m$^2$, whereas the power efficiency of the OLED comprising the bare ITO anode is approximately 5 lm/W at a luminance of 1000 cd/m$^2$. The increased power efficiency suggests that the chlorine functionalization of the ITO anode has a significant effect on power efficiency.

Given the improved alignment of the work function of the chlorinated ITO anode and the HOMO of the CBP layer, it may be possible to forego the several HILs and HTLs that are typically required in such a device construction without an unacceptable loss of efficiency. Foregoing the requirement for HTLs is advantageous, as the number of processing steps required to construct the OLED device may be reduced, thereby increasing the manufacturing yield of OLED devices and reducing costs associated with their production.

The halogen functionalized electrode in the examples above contributes little series impedance to the device. For example, a chlorine-functionalized ITO anode was prepared for use in a single-carrier hole-only organic device. The structure of the device is as follows: anode/α-NPD (536 nm)/Ag (50 nm). A first device comprising a bare UV ozone treated anode was compared to a second device having a UV ozone treated ITO anode coated with 1 nm of vacuum deposited MoO$_3$, and a third device comprising a chlorine-functionalized ITO anode. The hole injection barrier height between the anode and the α-NPD organic layer was measured for each device using UPS. The hole injection barrier height was 0.6 eV for bare UV ozone treated ITO, 0.45 eV for UV ozone treated ITO coated with 1 nm of vacuum deposited MoO$_3$ and 0.45 eV for chlorine-functionalized ITO. The performance of the device with the UV ozone treated ITO coated with 1 nm MoO$_3$ may initially be expected to be the same as the device with the chlorine-functionalized ITO since the barrier height for holes is the same for both devices.

Figure 26:
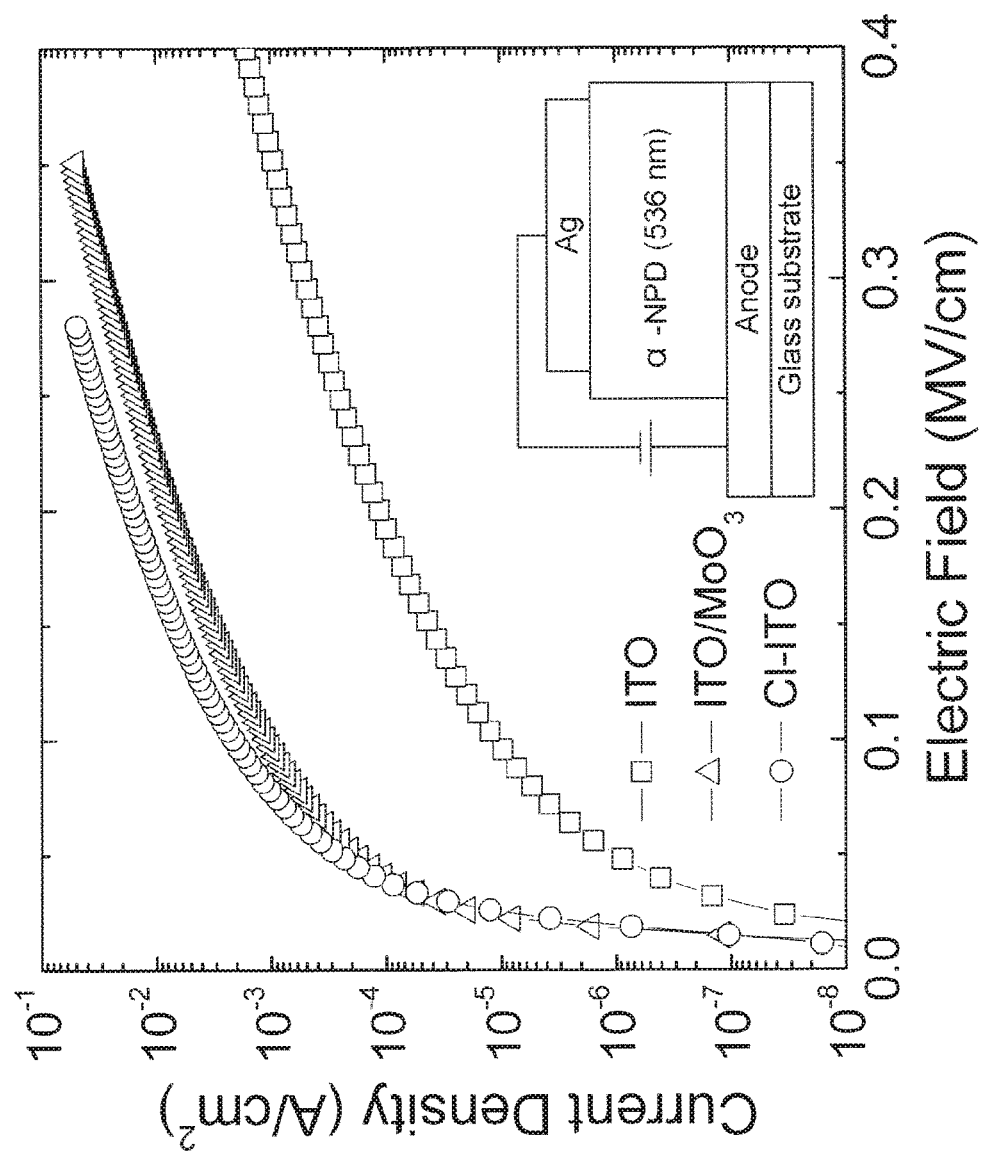
FIG. 26 is a chart showing the current density with respect to electric field for chlorine functionalized ITO anode with respect to other anode types.

FIG. 26 is a diagram showing the current-voltage characteristics of the example single-carrier hole-only organic devices described above. The current density at a given voltage is highest for the device with the chlorine-functionalized ITO anode. The device with the UV ozone treated ITO anode coated with 1 nm MoO$_3$ is nevertheless exhibiting a higher current density at any given voltage than the device with the bare UV ozone treated ITO anode due its lower hole injection barrier height. Unexpectedly, the current density for the device with the chlorine-functionalized ITO anode is higher at a given voltage than for the device with the UV ozone treated ITO anode coated with 1 nm MoO₃, despite the same barrier height for holes. The lower current density in the device with the UV ozone treated ITO anode coated with 1 nm MoO₃ shows that the MoO₃ layer introduces a series impedance into the device.

Figure 27:
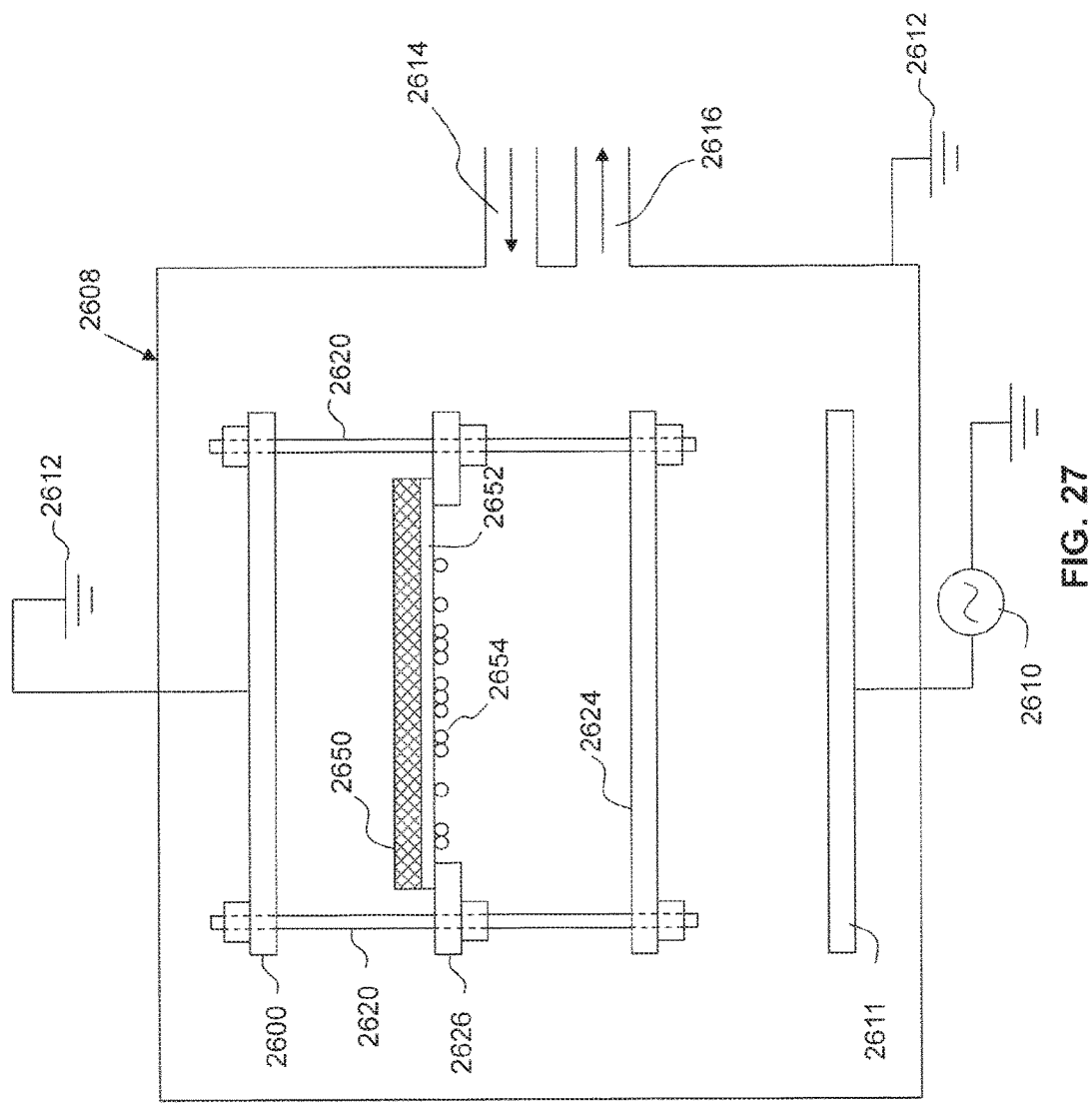
FIG. 27 is a diagram illustrating an example plasma functionalization apparatus in accordance with the present invention.

As was described above, a substrate may also be functionalized using a plasma. FIG. 27 is a plasma system for functionalizing a substrate. The system comprises a reaction chamber 2608, which is grounded 2612. The system may comprise a plurality of rods 2620 which support a substrate support 2626 upon which the substrate 2652 may be placed. The substrate 2652 is placed in electrical communication with the substrate support 2626. The substrate 2652 is deposited on a non-conductive mechanical support 2650, for example, glass. A high energy plasma shield 2624 is also provided. The plasma shield 2624 may also be supported by the rods 2620. The plasma shield 2624 is also grounded.

A radio frequency (RF) power source 2610 provides power to the powered electrode 2611. The reaction chamber 2608 comprises an inlet 2614 through which a gas comprising a precursor may be pumped and an outlet 2616 through which the vacuum chamber can be evacuated by a vacuum pump. The precursor may be a liquid or a gas. When the powered electrode 1611 is powered by an RF power source 2610, a plasma is generated between the powered electrode 2611 and the grounded portions of the system including the reaction chamber 2608. In particular, the highest energy plasma is generated in the region of the highest electric field, which may be between the powered electrode 2611 and the plasma shield 2624. However, plasma may also be generated elsewhere in the chamber 2608.

It will be appreciated that various plasma methods for generating halogen-containing plasmas may be used, including glow discharged based plasmas. It will also be appreciated that plasma may be used in combination with UV light treatment to functionalize a substrate. For example, dichlorobenzene diluted in argon gas may be used with ultra-violet light or with radio frequency electromagnetic radiation to functionalize a substrate with a halogen species.

The plasma causes the dissociation of any precursors in the reaction chamber. The dissociated precursors may then react with the surface of the substrate 2652 to begin to form a monolayer 2654. As is well known, particles in the plasma may have a substantial kinetic energy. The plasma shield 2624 prevents the plasma having the highest kinetic energy from directly impinging on the surface of the substrate 2652, thereby reducing the etching effects on the substrate 2652.

By way of example, the chamber may be pumped down to about 250 mTorr and 1,2-dichlorobenzene may be leaked in as a precursor for an ITO substrate. The substrate may be treated for approximately 5 minutes. Etching of the substrate was minimized due to the positioning of the substrate behind the plasma shield 2624. The functionalized substrate may be cleaned to remove residual contaminates.

Figure 28:
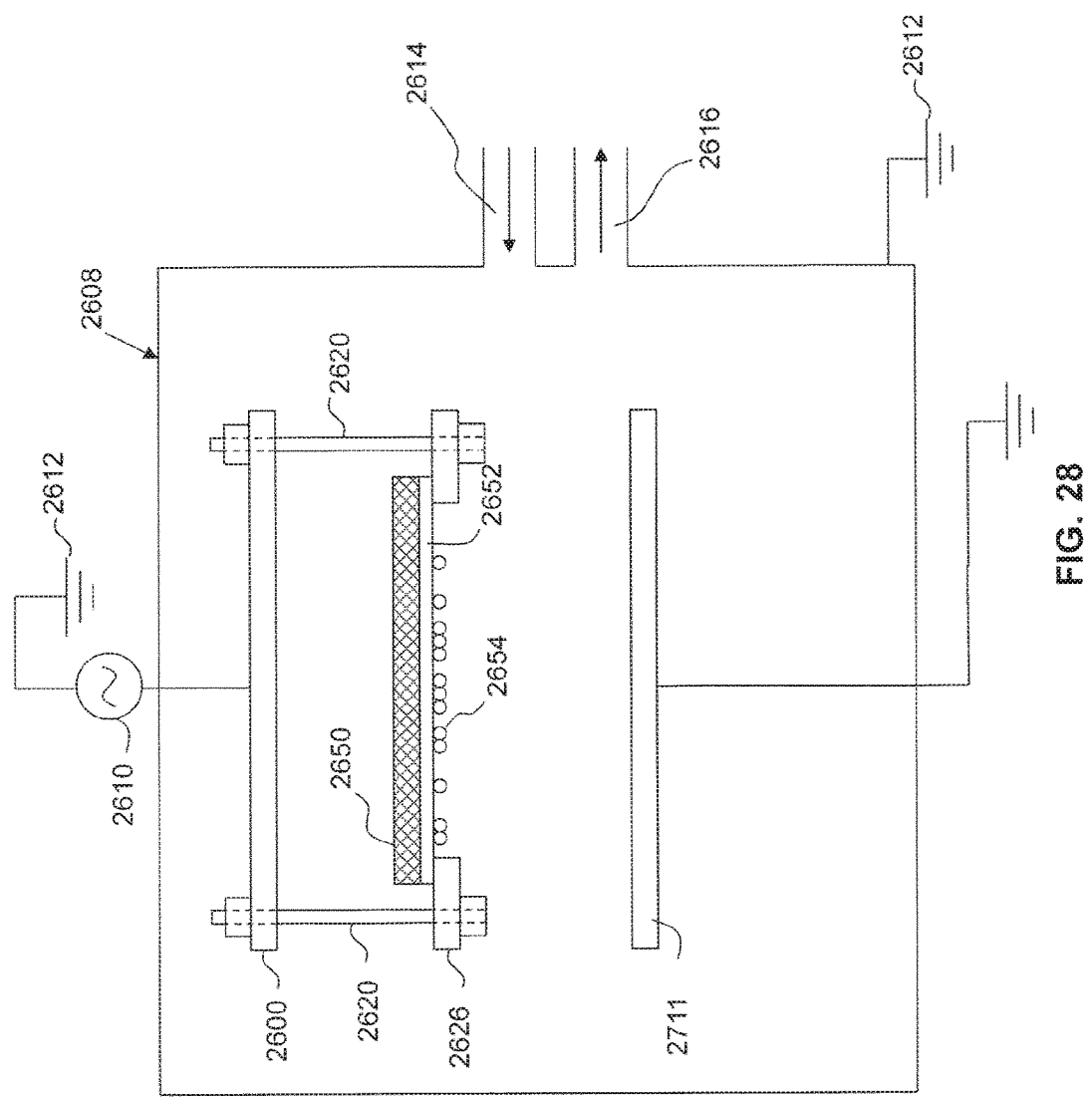
FIG. 28 is a diagram illustrating another example plasma functionalization apparatus in accordance with the present invention.
Figure 29:
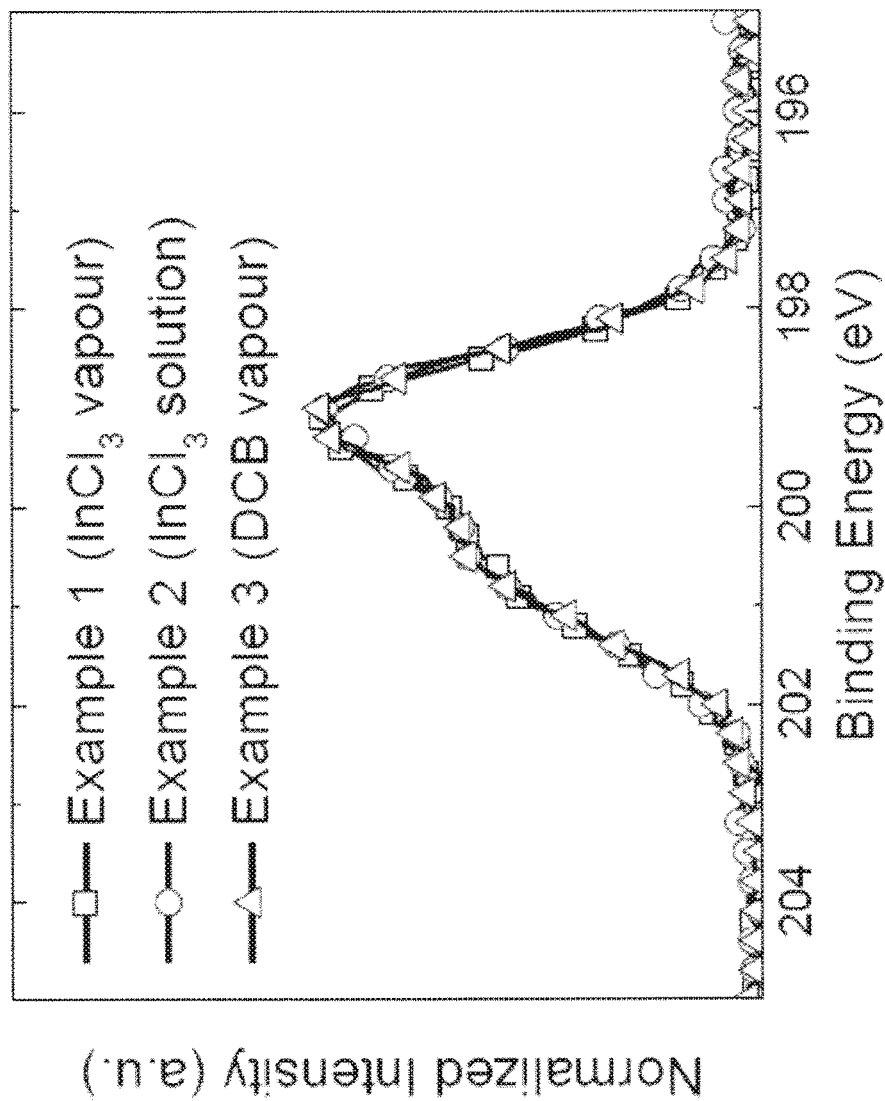
FIG. 29 is an energy level diagram of an example phosphorescent green OLED comprising an ITO anode functionalized with chlorine

Another example plasma system for functionalizing a substrate is provided in FIG. 28. In the example of FIG. 28, the RF power source 2610 is connected to the substrate support 2626, and hence, to the substrate 2652 itself. A grounded electrode 2711 is positioned in a parallel arrangement with the substrate 2652. When the power source 2610 is activated, a plasma is generated between the grounded electrode 2711 and the substrate 2652. As outlined above, the plasma causes the dissociation of any precursors in the reaction chamber. The dissociated precursors may then react with the surface of the substrate 2652 to begin to form a monolayer 2654. To mitigate any etching effects of the plasma, the gas comprising the precursor may be diluted with a carrier gas, as is outlined below.

It will be appreciated that various known precursor-containing gases may be used. For example, other halogen-containing precursors or fluorocarbon-containing precursors may be used. Example precursors include bromine, chlorine, tri-chloroethane, dichlorobenzene, haloalkanes, haloakenes, and haloaromatics. Common chlorinated precursors include chloromethane, dichloromethane, trichloromethane, tetrachloroethane, perchloroethylene, tetrachloroethylene, 1,1,2,2-tetrachloroethane, 1,1,2-trichloroethane, carbon tetrachloride, chloroform, methylene chloride, trichloroethylene, methyl chloroform, 1,1,1-trichloroethane, 1,2,3-trichloropropane, ethylene dichloride, dichloropropane, dichlorobenzene, propylene dichloride, 1,2-dichloroethylene, 1,1 dichloroethane, etc. The precursor may also comprise a halogen-containing polymer. Inorganic precursors may also be used. Examples of inorganic precursors include pure halogen gases, hydrogen halides, boron halides, sulphur halides, and phosphorus halides.

A difference in ionization energy between the precursor and carrier gas can be advantageously used to affect the amount of halogen radicals or ions generated using electromagnetic radiation. For example, in a plasma-based process using RF electromagnetic radiation chlorine gas may ionize more readily than argon gas. Therefore, although the concentration of chlorine in argon may be relatively low, for example, 1%, the concentration of active ionized chlorine species in the plasma may be much higher.

The precursor may comprise a mixture of various halogen-containing precursors. An oxidizing agent, for example oxygen, may also be added to the diluted precursor mixture to increase the removal of carbon impurities from the surface of the substrate.

Plasma functionalization of the substrate may be employed in procedures whereby a UV treatment may be damaging to the substrate, or otherwise adversely affect the substrate. For example, in some cases, thin film transistors (TFTs) on the substrate may be damaged by UV radiation. Specifically, UV radiation may degrade a semiconductor substrate including silicon substrates and indium gallium zinc oxide (IGZO) substrates.

Functionalization of a substrate using plasma may be advantageous, as the plasma treatment is typically conducted under vacuum, as are many other steps of OLED fabrication. As such, the functionalization process can be conducted in the same line of operations as other steps of OLED fabrication without requiring a substantial increase in pressure, thereby reducing the time required to perform the functionalization step. Furthermore, existing plasma equipment may be used to functionalize substrates. Existing plasma equipment may be used even for large substrates including so-called "Generation 8" substrates, which are 2.2 m by 2.5 m.

In another example, the plasma may make use of a carrier gas to reduce the concentration of the halogen-containing species. A gas having a lower concentration of halogen-containing species may be safer to handle and may further reduce the etching effects of the plasma. For example, pure chlorine gas is extremely toxic and corrosive and is typically stored in pressurized cylinders. Chlorine gas that has been diluted with a carrier gas, for example, 1% chlorine gas in an argon carrier, is less toxic and corrosive.

By way of example, the carrier gas may comprise a noble gas, for example, argon. Other example carrier gases include helium, neon, krypton, and xenon. The carrier gas may comprise a mixture of these gases in various proportions.

The carrier gas may comprise up to about 99.9% of the total gas volume. For example, the halogen-containing precursor may be introduced at concentrations of about 0.1%, 1%, 5%, or 10% with one or more carrier gases comprising the balance. The concentration of the halogen-containing precursor may be selected depending on the desired processing time, fractional coverage of the substrate, reactivity of the halogen and substrate, or various other processing parameters. Lower concentrations of halogen-containing precursor plasmas have comparatively lower etching rates than higher concentrations of the same species.

For example, the concentration of the gas containing the halogen-containing precursor may be 5% in a 95% carrier gas. In a specific example, a 5% dichlorobenzene and 95% argon mixture may be used.

By way of example, an ITO substrate coated on a glass sheet was functionalized with chlorine gas diluted in an argon carrier gas at a concentration of about 1%, as out below.

ITO substrates were cleaned with detergent, acetone and methanol and loaded into a commercial Advanced Energy reactive ion etching system. The processing chamber was pumped down to a base pressure of 10-2 Torr using a scroll-pump. Chlorine gas diluted in argon at 1% concentration was leaked into the processing chamber using a mass flow controller to a pressure of between 1 and 10 mTorr. A forward radio frequency power of about 50 W at 13.56 MHz was applied to the processing chamber, resulting the formation of a chlorine and argon plasma. The substrate was treated for 10 seconds. It will be appreciated that other treatment times, operating pressures and plasma powers may be used. In this example, a relatively low power was chosen to minimize etching of the sample.

The work function of the treated sample was measured using x-ray photoelectron spectroscopy and was found to be >6.0 eV. The Cl 2p core-level of chlorine on the surface of the sample suggests the formation of In—Cl bonds. The surface roughness of the sample measured using atomic force microscopy was found to be about 2 nm, which is substantially the same as the bare substrate prior to the plasma treatment.

Organic light emitting diodes with the structure of CBP (35 nm)/CBP:Ir(ppy)2(acac) (8%, 15 nm)/TPBi (65 nm)/LiF (132 nm)/Al (100 nm) were fabricated on the plasma functionalized ITO substrates. These OLEDs exhibited a relatively high external quantum efficiency of 24%, demonstrating that such processes can be used to prepare electrodes for organic optoelectronic devices, such as OLEDs. It will be appreciated that although ITO was used, other substrates may be functionalized with halogens using a similar process, for example, other transparent conducting oxides (TCOs), metal oxides or metals may be functionalized.

A process similar to that described above may also be used for functionalization using other halogens or for functionalizing a surface with chalcogenides, for example sulfur from a sulfur containing precursor diluted in a carrier gas. Functionalizing a substrate with chlorine using RIE is also possible.

As described above, metal halides may be used as precursors. Example processes for functionalizing an ITO substrate using metal halide precursors are set out below. Specifically, an ITO substrate was functionalized with chlorine from a metal chloride precursor in the vapour phase in Example 1, in the liquid phase in Example 2, and using an organic precursor in Example 3.

EXAMPLE 1

An ITO coated glass substrate was ultrasonically cleaned with a standard regiment of Alconox™ dissolved in deionized (DI) water, acetone, and methanol. The ITO substrates were then treated using UV ozone treatment for 3 minutes in a PL16-110 Photo Surface Processing Chamber (Sen Lights).

The surface of the ITO substrate was exposed to $InCl_3$ in the vapour phase in a vacuum chamber by subliming $InCl_3$ powder from an alumina crucible. The exposure was equivalent to depositing about a 5 Å thick layer of $InCl_3$ on the surface of the substrate as determined by a quartz crystal microbalance.

The ITO substrate was treated using UV ozone treatment for 3 minutes in a PL16-110 Photo Surface Processing Chamber.

EXAMPLE 2

An ITO coated glass substrate was ultrasonically cleaned with a standard regiment of Alconox™ dissolved in deionized (DI) water, acetone, and methanol. The ITO substrates were then treated using UV ozone treatment for 3 minutes in a PL16-110 Photo Surface Processing Chamber.

The surface of the ITO substrate was exposed to a dilute solution of $InCl_3$ dissolved in ethanol by spin-coating the solution onto the surface of the substrate at 2000 rpm.

The ITO substrate was treated using UV ozone treatment for 3 minutes in a PL16-110 Photo Surface Processing Chamber.

EXAMPLE 3

An ITO coated glass substrate was ultrasonically cleaned with a standard regiment of Alconox™ dissolved in deionized (DI) water, acetone, and methanol. The ITO substrates were then treated using UV ozone treatment for 3 minutes in a PL16-110 Photo Surface Processing Chamber.

The surface of the ITO substrate was treated with 1,2-dichlorobenzene (DCB) vapour in a closed Pyrex® Petri dish under UV irradiation in a PL16-110 Photo Surface Processing Chamber for 10 minutes.

The ITO substrate was treated using UV ozone treatment for 3 minutes in a PL16-110 Photo Surface Processing Chamber.

The chemical composition and work function of all of the substrates were characterized using x-ray photoelectron spectroscopy (XPS) in a PHI 5500 Multi-Technique System using monochromatic Al $K_\alpha$ (hv=1486.7 eV). An x-ray photoelectron spectroscopy (XPS) spectrum is provided in FIG. 28 to show the chemical state of the chlorine bonded to the surface using the three example procedures set out above. Specifically, the XPS spectrum shows the 2p core-level energy spectrum of the three different chlorine functionalized ITO substrates, functionalized using $InCl_3$ vapour (Example 1). $InCl_3$ in solution (Example 2), and DCB vapour using UV light. The similarities between the Cl 2p core-level spectrum for the three different chlorine functionalized substrates suggests that the surface chemical state of the three samples is similar.

As such, FIG. 28 indicates that the surface of ITO can be reacted with $InCl_3$ in the vapour phase and $InCl_3$ dissolved in solution to functionalize the surface with chlorine. The work function of each of the three chlorine functionalized ITO substrates can be estimated to be 6.05±0.05 eV. Since the surface chemical state and work function of the ITO substrates functionalized with $InCl_3$ vapour and $InCl_3$ dissolved in solution are similar to the ITO substrate functionalized using dichlorobenzene and UV light.

It will be appreciated that the substrates functionalized using a metal halide are expected to function in the same way when used in a device, for example an OLED, as the ITO substrates described above, given their similar chemical structure.

It can be appreciated that potential applications of organic optoelectronic devices comprising substrates functionalized according to the method described herein comprise organic photovoltaics, OLEDs, organic thin film transistors, and biomedical devices. It will be appreciated that although reference is made to organic electronic devices comprising TCO functionalized electrodes, inorganic electronic devices may comprise functionalized TCO electrodes. For example, LCD electrodes may be functionalized using the process as described herein.

Other potential applications of substrates functionalized according to the methods described above comprise functionalizing a substrate to adjust surface energy, and templating growth of materials on a substrate that has been selectively functionalized.

It will be appreciated that although examples were provided disclosing the functionalization of TCO substrates, other types of substrates may be functionalized. For example, metals, polymers (including conductive polymers), and ceramics may be functionalized with a species using the process as described herein.

Although example methods of functionalizing substrates are provided above, it will be appreciated that substrates may be functionalized using methods other than those described. For example, it will be appreciated that electrodes comprising TCO substrates may be functionalized with up to about a monolayer of a halogen species using methods other than those described above.

Although the above has been described with reference to certain specific example embodiments, various modifications thereof will be apparent to those skilled in the art without departing from the scope of the claims appended hereto.

We claim:

1. A method for increasing the work function of a substrate, the method comprising:
   providing a mixture comprising a precursor and a carrier gas;
   applying energy to the mixture to generate a plasma to obtain an electronegative species from the precursor; and
   reacting the substrate with the electronegative species to bond the electronegative species to the substrate, wherein the concentration of the precursor in the mixture is less than the concentration of the carrier gas to reduce etching of the substrate when reacting the substrate with the electronegative species, wherein the substrate is a transparent conductor, and wherein the electronegative species is chlorine.

2. The method of claim 1, wherein the transparent conductor is selected from the group consisting of nickel oxide, molybdenum oxide, tungsten oxide, gold oxide, indium oxide, cadmium oxide, cadmium tin oxide, zinc tin oxide, antimony tin oxide, aluminum zinc oxide, titanium zinc oxide, gallium zinc oxide, aluminum gallium zinc oxide, indium gallium zinc oxide, gallium indium oxide, zinc indium oxide, gallium indium tin oxide, zinc indium tin oxide, titanium indium oxide, tin cadmium oxide, indium cadmium oxide, zinc cadmium oxide, aluminum cadmium oxide, and gold.

3. The method of claim 1, wherein the carrier gas is selected based on a difference between the ionization energy of the carrier gas and the ionization energy of the precursor.

4. The method of claim 1, wherein the carrier gas is an inert gas or a noble gas.

5. The method of claim 1, wherein the carrier gas is selected from the group consisting of argon, helium, neon, krypton, xenon, oxygen, and nitrogen.

6. The method of claim 1, wherein the precursor is selected from the group consisting of chlorine, tri-chloroethane, dichlorobenzene, chloromethane, dichloromethane, trichloromethane, tetrachloroethane, perchloroethylene, tetrachloroethane, 1,1,2,2-tetrachloroethane, 1,1,2-trichloroethane, carbon tetrachloride, chloroform, methylene chloride, trichloroethylene, methyl chloroform, 1,1,1-trichloroethane, 1,2,3-trichloropropane, ethylene dichloride, dichloropropane, dichlorobenzene, propylene dichloride, 1,2-dichloroethylene, 1,1 dichloroethane, and metal halides.

7. The method of claim 1, wherein the coverage of the electronegative species on the substrate is selected to obtain a predetermined work function.

8. The method of claim 1, wherein at least 10% of a monolayer of the electronegative species is bonded to the substrate.

9. The method of claim 1, wherein at least 25% of a monolayer is bonded to the substrate.

10. The method of claim 1, wherein at least 80% of a monolayer is bonded to the substrate.

11. The method of claim 1, wherein the plasma duration and power are selected to reduce etching of the substrate.

12. The method of claim 1, wherein the substrate is shielded from the plasma to reduce etching of the substrate.

13. The method of claim 1, wherein the concentration of the precursor is less than 10%.

14. The method of claim 13, wherein the concentration of the precursor is less than 5%.

15. The method of claim 14, wherein the concentration of the precursor is less than 1%.

16. The method of claim 15, wherein the concentration of the precursor is less than 0.1%.

* * * * *